United States Patent
Trantham et al.

(10) Patent No.: US 12,112,821 B2
(45) Date of Patent: Oct. 8, 2024

(54) READ DESTRUCTIVE MEMORY WEAR LEVELING SYSTEM

(71) Applicant: Seagate Technology LLC, Fremont, CA (US)

(72) Inventors: Jon D. Trantham, Chanhassen, MN (US); Praveen Viraraghavan, Chicago, IL (US); John W. Dykes, Eden Prairie, MN (US); Ian J. Gilbert, Chanhassen, MN (US); Sangita Shreedharan Kalarickal, Eden Prairie, MN (US); Matthew J. Totin, Excelsior, MN (US); Mohamad El-Batal, Superior, CO (US); Darshana H. Mehta, Shakopee, MN (US)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 0 days.

(21) Appl. No.: 17/845,643

(22) Filed: Jun. 21, 2022

(65) Prior Publication Data
US 2022/0406396 A1 Dec. 22, 2022

Related U.S. Application Data

(60) Provisional application No. 63/213,892, filed on Jun. 23, 2021, provisional application No. 63/213,250, filed on Jun. 22, 2021, provisional application No. 63/213,252, filed on Jun. 22, 2021, provisional application No. 63/212,865, filed on Jun. 21, 2021.

(51) Int. Cl.
*G11C 29/44* (2006.01)
*G11C 16/34* (2006.01)
*G11C 29/12* (2006.01)
*G11C 29/46* (2006.01)

(52) U.S. Cl.
CPC ...... *G11C 29/4401* (2013.01); *G11C 16/3495* (2013.01); *G11C 29/1201* (2013.01); *G11C 29/46* (2013.01)

(58) Field of Classification Search
CPC ........... G11C 29/4401; G11C 16/3495; G11C 29/1201
See application file for complete search history.

(56) References Cited

U.S. PATENT DOCUMENTS

| | | |
|---|---|---|
| 5,270,967 A | 12/1993 | Moazzami et al. |
| 6,008,659 A | 12/1999 | Traynor |
| 6,091,625 A | 7/2000 | Braun et al. |

(Continued)

*Primary Examiner* — Han Yang
(74) *Attorney, Agent, or Firm* — HOLZER PATEL DRENNAN

(57) ABSTRACT

A data storage system can utilize one or more data storage devices that employ a solid-state non-volatile read destructive memory consisting of ferroelectric memory cells. A leveling strategy can be generated by a wear module connected to the memory with the leveling strategy prescribing a plurality of memory cell operating parameters associated with different amounts of cell wear. The wear module may monitor activity of a memory cell and detect an amount of wear in the memory cell as a result of the monitored activity, which can prompt changing a default set of operating parameters for the memory cell to a first stage of operating parameters, as prescribed by the leveling strategy, in response to the detected amount of wear.

20 Claims, 11 Drawing Sheets

(56) References Cited

U.S. PATENT DOCUMENTS

| | | | |
|---|---|---|---|
| 6,246,603 B1 | 6/2001 | Brady | |
| 6,590,798 B1 | 7/2003 | Komatsuzaki | |
| 6,894,549 B2 | 5/2005 | Eliason | |
| 6,914,853 B2 | 7/2005 | Coulson | |
| 7,667,997 B2 | 2/2010 | Rodriguez | |
| 8,422,303 B2 | 4/2013 | Franca-Neto et al. | |
| 8,495,438 B2 | 7/2013 | Roine | |
| 8,909,888 B2 | 12/2014 | Goss et al. | |
| 8,995,197 B1 | 3/2015 | Steiner et al. | |
| 9,135,160 B1 | 9/2015 | Zheng et al. | |
| 9,361,965 B2 | 6/2016 | Rodriguez-Latorre et al. | |
| 9,898,364 B2 | 2/2018 | Higgins et al. | |
| 10,324,648 B1 * | 6/2019 | Goss | G11C 29/52 |
| 10,747,909 B2 | 8/2020 | Weidele et al. | |
| 10,754,093 B2 | 8/2020 | Liu et al. | |
| 2022/0036960 A1 * | 2/2022 | Ingram | G06F 12/0238 |
| 2022/0137827 A1 * | 5/2022 | Schaefer | G06F 3/0679 |
| | | | 711/154 |
| 2022/0317916 A1 * | 10/2022 | Boehm | G06F 3/0604 |

* cited by examiner

READ DESTRUCTIVE MEMORY WEAR LEVELING SYSTEM

RELATED APPLICATION

The present application makes a claim of domestic priority to U.S. Provisional Patent Application No. 63/212,865 filed Jun. 21, 2021, the present application makes a claim of domestic priority to U.S. Provisional Patent Application No. 63/213,252 filed Jun. 22, 2021, the present application makes a claim of domestic priority to U.S. Provisional Patent Application No. 63/213,250 filed Jun. 22, 2021, and the present application makes a claim of domestic priority to U.S. Provisional Patent Application No. 63/213,892 filed Jun. 23, 2021, the contents of which are hereby incorporated by reference.

SUMMARY

The present disclosure is generally directed to leveling wear in a data storage device memory consisting of read destructive memory cells.

Assorted embodiments employ a module to generate a leveling strategy with a plurality of memory cell operating parameters associated with different amounts of cell wear. The module monitors activity of a memory cell and detects an amount of wear in the memory cell as a result of the monitored activity. The detection, or prediction, of memory cell wear prompts changing a default set of operating parameters for the memory cell to a first stage of operating parameters, as prescribed by the leveling strategy.

DETAILED DESCRIPTION

Various embodiments present a data storage system employing a leveling module that intelligently monitors the health of read destructive memory cells and levels experienced cell wear over time through execution of a leveling strategy proactively generated by the leveling module.

The advent of solid-state memory has provided faster data access speeds and smaller physical dimensions than previously available from non-volatile data storage. However, solid-state memory can suffer from operational degradation over time, which poses processing difficulties that can jeopardize data reliability and/or data access performance. Despite advancements in solid-state memory materials and configurations that provide even faster data access speeds, memory cell wear can be experienced and create difficulties in satisfying guaranteed data access consistency, particularly when different cells of a memory array experience different levels of wear. Hence, embodiments of a data storage system utilize a leveling module to detect cell wear without exacerbating cell health degradation and to level wear across a memory array to increase the capability of the array to provide consistent data access performance for one or more hosts.

Accordingly, a leveling module can intelligently determine the wear status of memory cells and conduct a variety of different actions to repair, mitigate, or balance cell wear to optimize the data access performance and reliability. The ability to detect cell wear without specific cell health tests involving cell access allows the leveling module to manage cell wear without exacerbating the condition of the cell. The proactive generation of a leveling strategy and operational triggers for specific memory cells, or groups of memory cells, allows the leveling module to proactively and/or reactively execute actions to provide maximum data storage performance and reliability along with greater cell operational lifespan.

Figure 1:
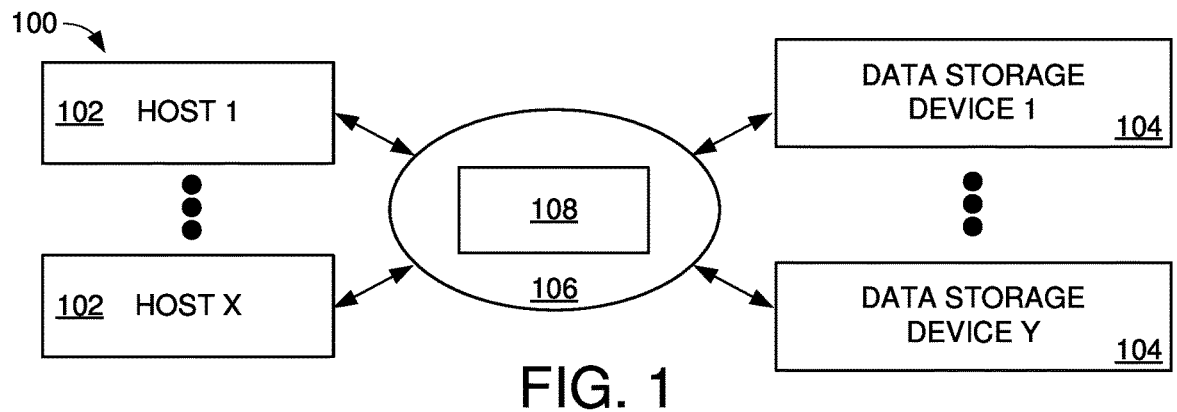
FIG. 1 provides a functional block representation of a data storage system in which various embodiments can be practiced.

FIG. 1 depicts a block representation of an example data storage system 100 is shown where assorted embodiments may be practiced. The data storage system 100 connects any number (X) of hosts 102 to any number (Y) data storage devices 104 via one or more wired and/or wireless networks 106. The various hosts 102 can be positioned in any location with any type, performance, and capability to create, transfer, and receive data stored in one or more data storage devices 104. The assorted data storage devices 104 are not limited to a uniform configuration and can have any capacity, performance capability, and type of memory to store data. It is contemplated that the respective data storage devices 104 employ non-volatile memory, such as solid-state memory cells and/or rotating magnetic media, that are employed by a network controller 108 to satisfy data access requests from one or more hosts 102.

Figure 2:
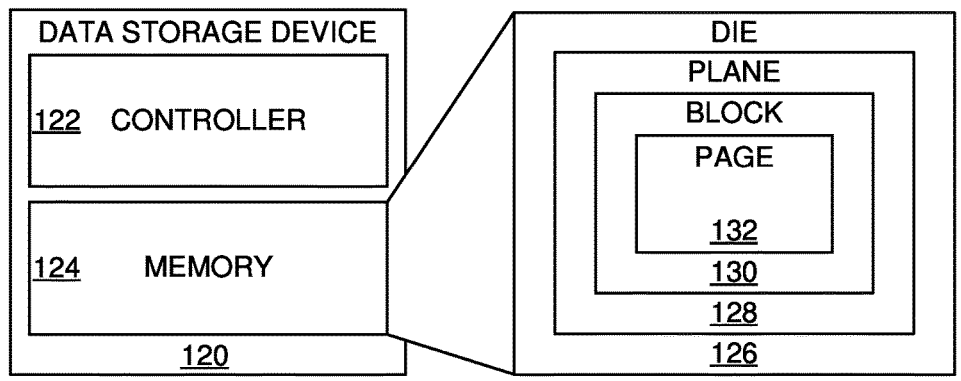
FIG. 2 depicts a block representation of portions of an example data storage device capable of being used in the data storage system of FIG. 1 in some embodiments.

FIG. 2 depicts a block representation of portions of an example data storage device 120 that may be utilized in the data storage system 100 of FIG. 1. The data storage device 120 has a local controller 122 that directs operation of one or more memories 124 to store, and retrieve, data in response to requests from one or more external hosts 102. A memory 124, in some embodiments, consists of non-volatile, solid-state type data storage cells that can be individually written or read. As shown, the assorted cells of a memory 124 can be logically and/or physically arranged into two-dimensional or three-dimensional die 126, planes 128, blocks 130, and pages 132 that are each collectively accessible at once. That is, a single die 126, plane 128, block 130, or page 132 can be read, or written, in a single instance, which provides efficient ingress and egress of data.

Figure 3A:
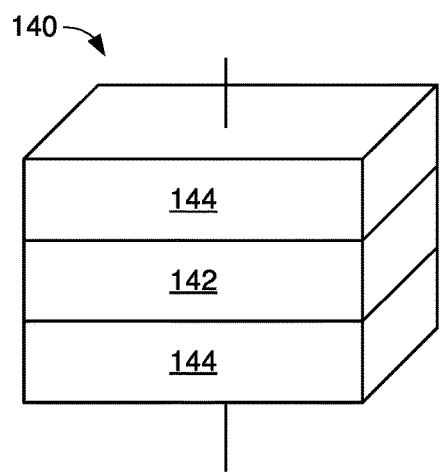
FIGS. 3A & 3B respectively shows aspects of an example memory configured in accordance with some embodiments.
Figure 3B:
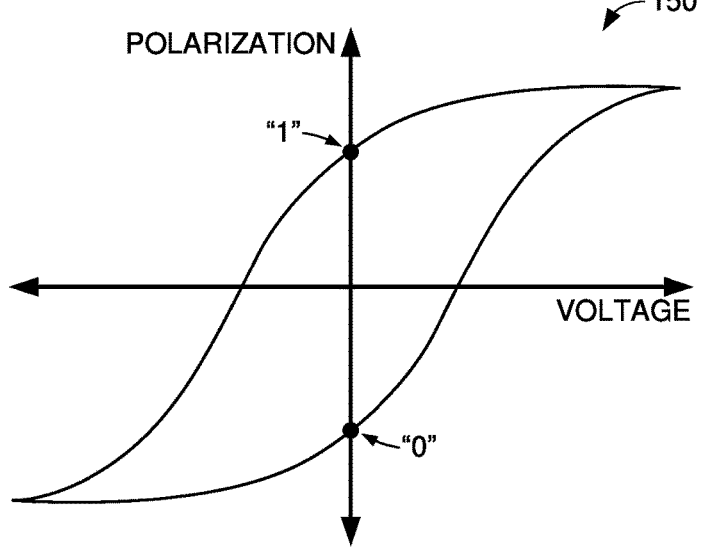

FIGS. 3A and 3B respectively illustrate assorted aspects of an example solid-state memory cell 140 that may be employed in a data storage device 120 and data storage system 100 to carry out various embodiments. FIG. 3A is a block representation of a solid-state non-volatile memory cell 140 that can be used to store host-generated data. Some embodiments of the memory cell 140 are a ferroelectric memory element (FME) that uses at least one ferroelectric film 142 to facilitate stable polarizations that logically represent at least one pair of "1" and "0" states. It is contemplated that the memory cell 140 uses capacitors, transistors, multiple ferroelectric layers, and/or multiple electrodes 144, such as ferroelectric tunnel junctions and ferroelectric field effect transistors, to enable a stable polarization when programmed with a predetermined electric field. Although a single FME is shown in FIG. 3A, various embodiments interconnect multiple separate cells 140 as part of a 2D or 3D page/block/plane/die all while allowing individual FME to be accessed at one time.

FIG. 3B is an example hysteresis loop 150 for the FME 140 that illustrates how the cell 140 reacts to different applied voltages. The reliability and repeatability of the hysteresis loop 150 provides an FME 140 with the ability to be used for various types and sizes of data. In addition, the configuration of the memory cell 140 as an FME provides density capabilities, data access speeds, and power savings that are better than flash memory, exhibit greater rewriting capabilities than dynamic random access memory, and are conducive to next-generation data storage devices and systems. However, most FME 140 structural configurations are read destructive and do not retain a programmed state/polarization once accessed during a read operation. An FME memory cell 140 also can suffer from wear that alters, and potentially, degrades the ability of the cell 140 to reliably be programmed and/or read.

Figure 4A:
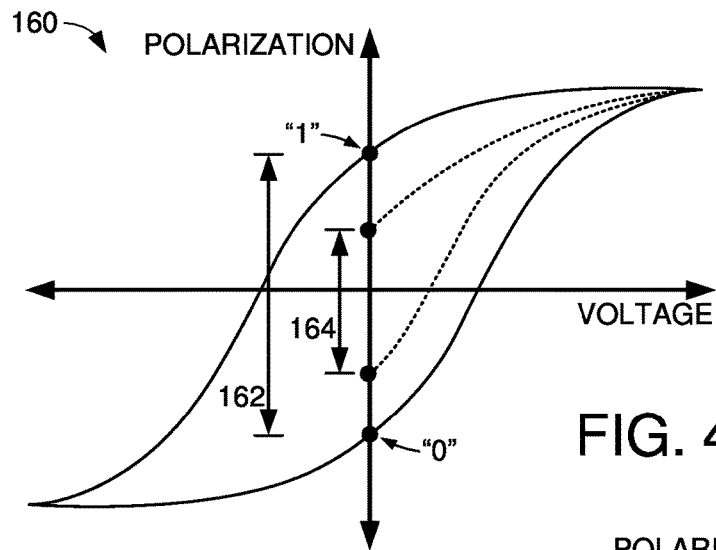
FIGS. 4A-4C respectively illustrate operational information for memory operated in accordance with assorted embodiments.
Figure 4B:
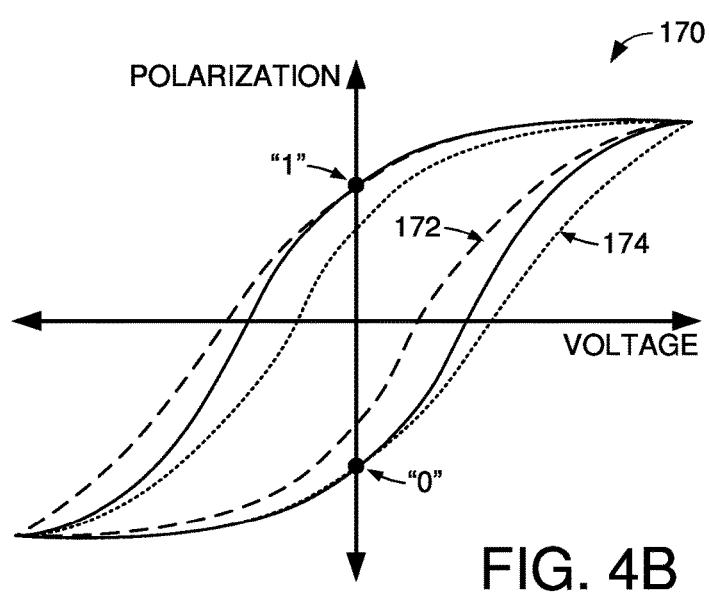
Figure 4C:
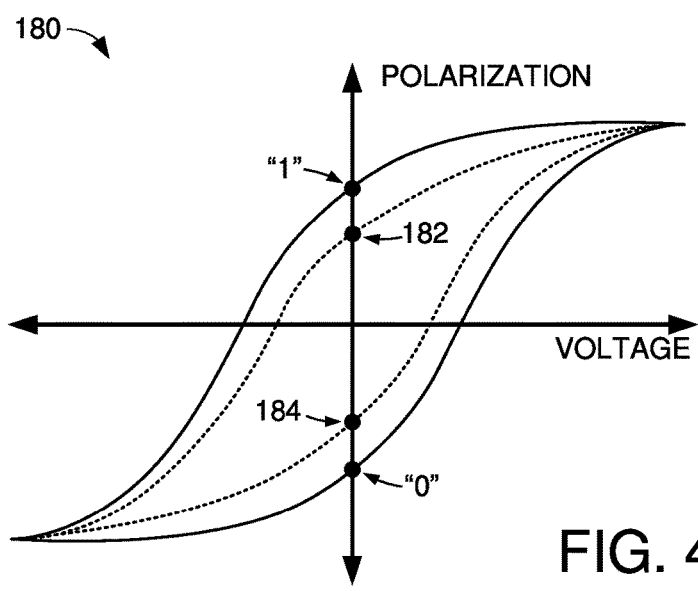

FIGS. 4A-4C respectively depict example hysteresis loops for different FME memory cell wear conditions. FIG. 4A displays a depolarization condition 160 with segmented lines where less polarization is experienced at a steady state, zero voltage. Such a decrease in polarization for one, or both, logical states (1/0) reduces the margin between the states, as shown by the difference between the original margin 162 and the depolarized margin 164. The reduced depolarized margin 164 can be the result of an FME cell experiencing relatively high (>70° C.) heat for short, or long, periods of time, which can increase that error rate for data reads as the difference between logical state polarizations is smaller.

FIG. 4B displays an imprint condition 170 that corresponds with an FME memory cell becoming resistive to reversals in polarization. The imprint condition 170, as shown by segmented lines, can involve a leftward 172, or rightward 174, shift in portions of the hysteresis loop. A practical result of the imprint condition 170 is degraded data writing as sufficient write voltage may not be used for a logical state reversal due to a loop shift. It is noted that an imprint condition 170 can be related to the amount of time a cell has been programmed in a single logical state, the number of times a cell has been written to a particular logical state. Imprint can be particularly degrading for data writing performance as the shifting of the hysteresis loop can occur gradually and may be difficult to detect unless dynamic write voltages are used over time.

In FIG. 4C, a hysteresis loop 180 conveys a fatigue condition for an FME where repeated reversals in programmed polarization correspond with a decrease in the polarization of the ferroelectric aspects of a memory cell. Segmented lines convey how the entire hysteresis loop 180 shrinks as a result of fatigue and reduces the polarization value for each logical state. Indeed, the decrease in polarization to states 182 and 184, as shown, can occur with the cyclic reading of a memory cell, not just cyclic writing, which adds complexity to the detection and correction of a fatigue condition. Much like the depolarization of portions of the hysteresis loop 160 in FIG. 4A, fatigue condition logical states 182/184 can be error-prone due to the relatively small margin between the states 182/184.

Figure 5:
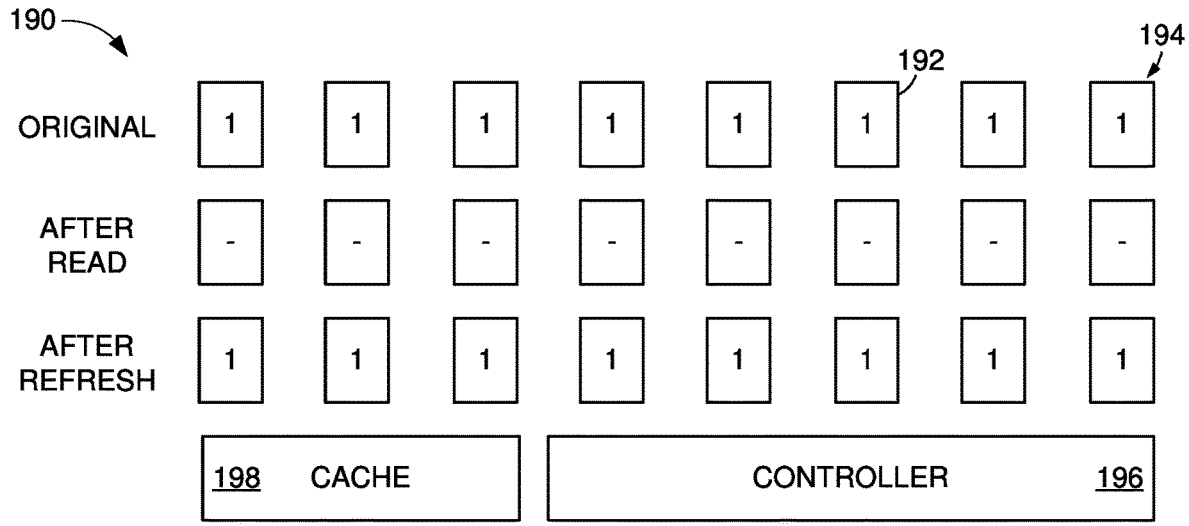
FIG. 5 depicts a block representation of aspects of an example memory employed in accordance with various embodiments.

With the assorted memory cell wear issues presented by depolarization, imprint, and fatigue conditions, simple utilization of memory cells over time can result in degraded reliability that jeopardizes the applicability of a memory for many industrial, commercial, and personal data storage applications. FIG. 5 depicts a block representation of portions of a data storage device 190 operated in accordance with some embodiments. A plurality of FME memory cells 192 are originally programmed with assorted logical states (0/1), as shown. However, the structural capabilities of the FME cells 192 cause each programmed state to be erased as the polarization of each cell 192 approaches zero, which renders each cell without a programmed state (–) that can be consistently read by any computing means.

While the originally programmed states can be read by a local, or remote, controller 194 before the respective cells 192 become unreadable, the controller 194 can be tasked with refreshing the programmed states to the respective cells 192 by conducting one or more write operations. In comparison to other, non-read destructive solid-state memory cells that can conduct a read operation without refreshing the programmed states with a write operation, FME cells 192 experience greater volumes of write operations as outputted data from a read operation is refreshed by the controller 194 from a local cache 196 or some other data storage location. Such cell writing activity can produce relatively high volumes of heat while consuming relatively large amounts of power and processing time compared to other types of memory. The addition of cell 192 health and wear being difficult to track and/or detect makes FME memory cell usage over time difficult and unreliable with current operation and management.

These issues have prompted the use of a leveling module that intelligently tracks activity of read destructive solid-state non-volatile memory cells to determine the presence, type, and severity of wear. The leveling module can further generate one or more leveling strategies that prescribe a schedule of cell operating parameter stages that allow a system to efficiently mitigate the proliferation of wear in a memory cell while maximizing cell performance despite the presence of operational wear that changes a cell's hysteresis loop. The ability to intelligently detect and/or predict memory cell wear and transition to different customized cell operating stages prevents processing bottlenecks associated with reactive detection of memory cell wear followed by generation of operating parameters to optimize the performance, longevity, and reliability of cells experiencing a wear condition.

Figure 6:
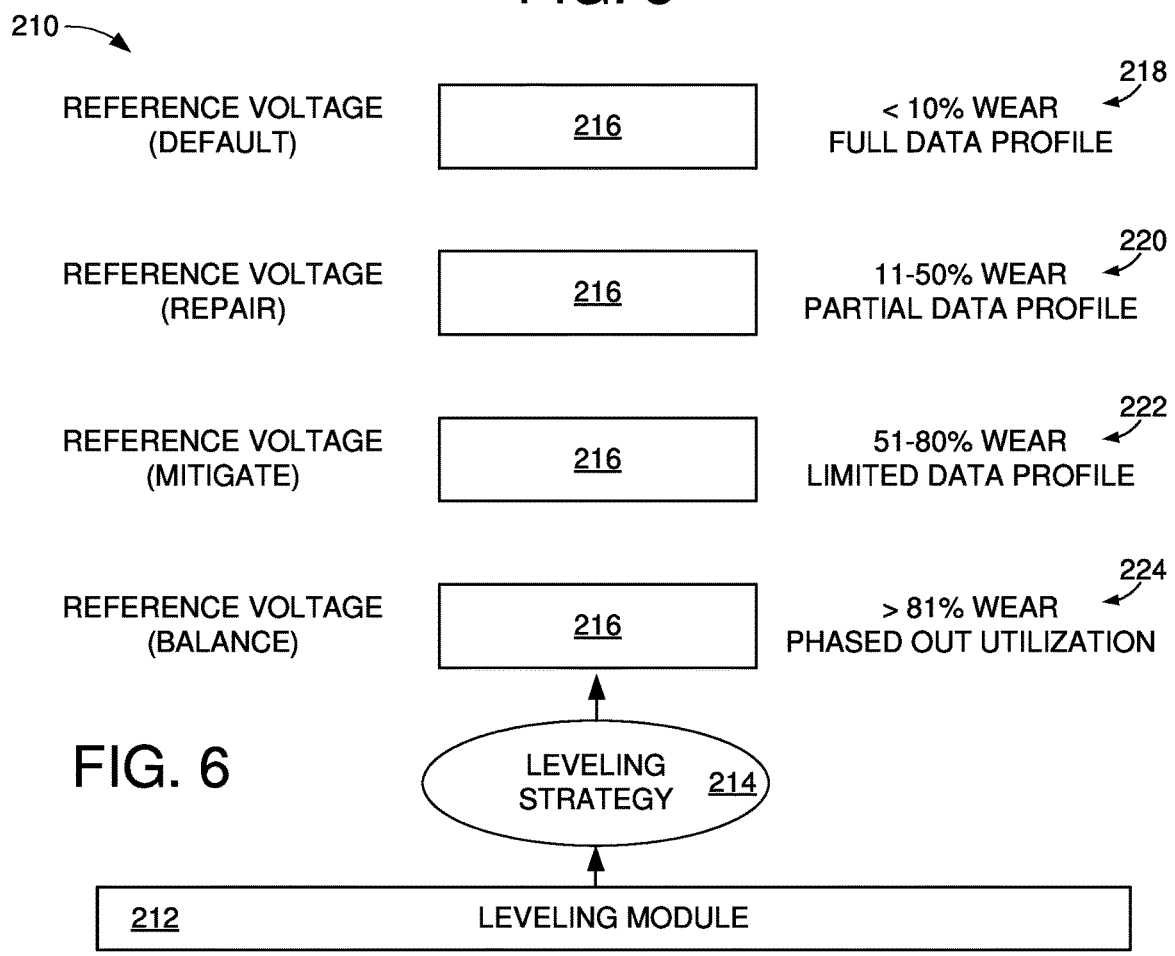
FIG. 6 displays a block representation of portions of an example data storage system configured and utilized in accordance with some embodiments.

FIG. 6 depicts a block representation of portions of an example data storage system 210 that employs a leveling module 212 that generates at least one leveling strategy 214 that prescribes assorted operational stages for one or more memory cells 216 to optimize operation despite the presence of operational wear. As shown with memory cell 216 that operates with minimal wear, such as less than 10% change in hysteresis loop shape and/or size, the leveling module 212 and strategy 214 execute a default operational stage 218 corresponding with default operating parameters, such as read voltage, write voltage, error correction, refresh rate, and type of data stored in the cell.

The default operational stage 218 can be conducted for any amount of time until the leveling module detects, or predicts, wear has exceeded the predetermined stage trigger, which in the non-limiting example of FIG. 6 is 10% change in a cell's hysteresis loop. Once cell wear exceeds the predetermined trigger, the leveling module 212 can automatically transition the worn cell to a repair operating stage 220 where one or more actions are conducted to correct the hysteresis loop of the memory cell toward a default shape and size. Although not required or limiting, some embodiments utilize the repair operational stage operating parameters while the cell wear range is 11-50% deviation from the default cell hysteresis loop configuration.

The actions to alter the operational parameters associated with the repair stage 220 are not limited and can alter one or more default operating parameters to correct wear. For instance, a cell may be logically rewritten instead of actually rewritten with data. Another example action in the repair stage 220 artificially toggles the polarization of a memory cell without a host-generated data access request. Yet another non-limiting example repair stage 220 action may involve reordering the execution of pending host-generated data access requests to mitigate heat from worn memory cells. That is, memory cells physically distant from a worn memory cell can be selectively accessed in satisfaction of data access requests in order to prevent the build-up of heat around the worn memory cell, which can exacerbate existing cell wear.

The leveling module 212 can implement one or more operational parameter deviations in the repair stage 220 on one or more memory cells, such as a page, block, plane, or die of cells, until a second wear trigger is present in a memory cell. The detection, or prediction, of memory cell wear above the second threshold, such as above 50% deviation from a hysteresis loop shape/size, can prompt the leveling strategy to transition to a mitigation operational stage 222 where different operational alterations are made in an attempt to reduce the performance degradation associated with the cell wear. For instance, the mitigation operational stage 222 can change the type of data being stored, such as altering to a more, or less, frequently accessed type of data. The mitigation operational stage 222 can, alternatively, move data to different physical addresses in a memory array to reduce the concentration of heat during use.

It is contemplated that the mitigation operational stage 222 has different operational deviations from default values for data programming and/or reading as well as background memory operations and/or error correction. Some embodiments that utilize multi-level memory cells capable of being programmed to 4 or more logical states may be repurposed in a mitigation operational stage 222 to a single level cell utilizing one pair of logical states. Mitigation actions, in some embodiments, reorganize logical associations of memory cells to reduce, or increase, the number of data accesses to a worn memory cell.

At a predetermined third threshold, such as 80% wear as measured by deviation from a default hysteresis loop shape/size, the leveling strategy 214 can transition one or more memory cells to a balance operational stage 224 where data access consistency and cell lifespan are focused goals. For example, memory cells with advanced wear can be utilized sporadically, such as for caching operations, and/or long-term data storage. The balance operational stage 224 may consist of deliberately inducing wear in at least one memory cell to provide consistent wear, and/or data access performance, across a plurality of memory cells, such as a page, block, plane, or die.

Memory cell operations altered to provide consistent wear and data access performance as a result of the balance operational stage 224 can allow relatively highly degraded cells to be utilized for general, or specific, data storage tasks. For instance, memory cells in the balance operational stage 224 can provide data access latency variability below a predetermined threshold to allow the cells to enter a deterministic window where a host is guaranteed a minimum level of data read latency consistency over time.

Embodiments of the leveling strategy configure memory cell operating parameters to be altered to increase the lifespan of the memory cell, which may correspond with lower than possible data access performance. A non-limiting example of the balance operating stage 224 employ minimum read and write voltages for data access operations, which can have higher than average error rates, but generates minimum heat and can prolong the usable lifespan of the memory cells. It is contemplated that the leveling module 212 generates custom memory cell reference voltages over time for the leveling strategy in an effort to balance error rate with prolonged memory cell lifespan.

Figure 7:
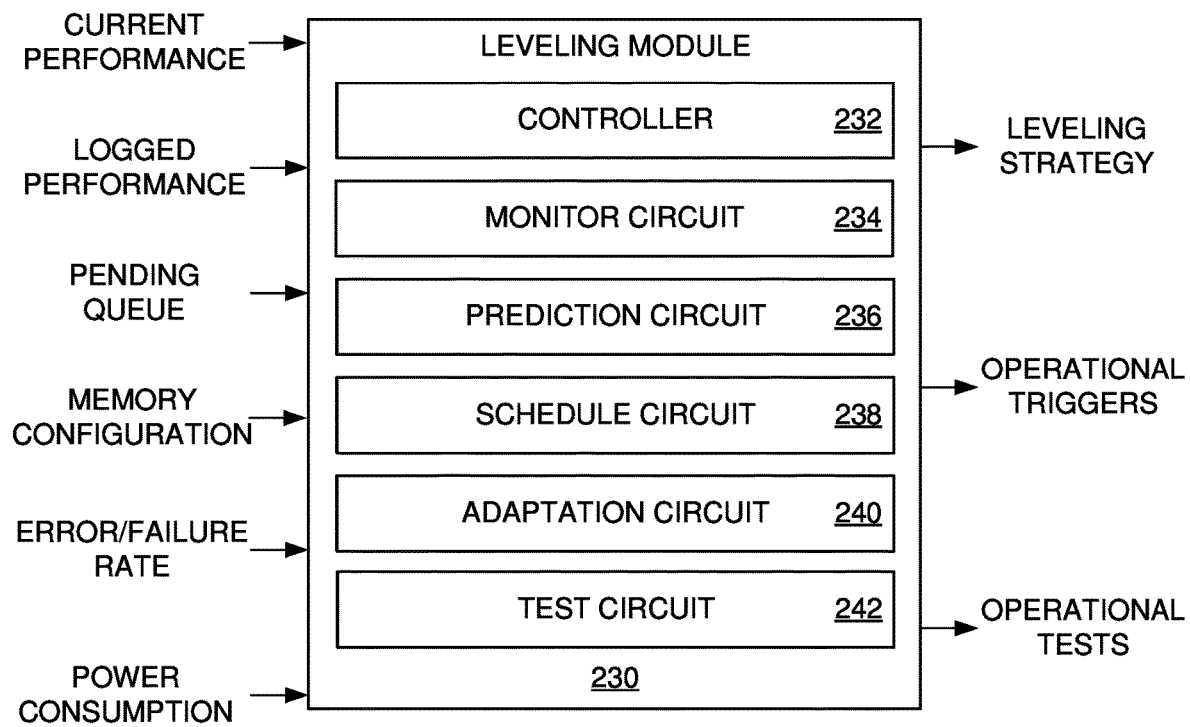
FIG. 7 depicts a block representation of an example leveling module that can be utilized in a data storage system and data storage device in assorted embodiments.

FIG. 7 depicts a block representation of an example leveling module 230 that can be employed in a data storage device and data storage system in accordance with various embodiments to provide intelligent memory cell wear monitoring and performance over time. The leveling module 230 can utilize a controller 232, such as a microprocessor or other programmable circuitry, to evaluate past and current memory conditions, operation, and performance to identify the health of FME memory cells and generate a leveling strategy that proactively and/or reactively controls cell wear conditions to increase the performance, longevity, or consistency of memory cell operation despite the presence of memory cell wear.

The leveling module 230 that can be present as software and/or hardware in a data storage device, in a network component, such as a server or node, or in a remote host. One or more controllers 232 that translate assorted input information into at least a leveling strategy, operational triggers, and operational tests. That is, a controller 232 can diagnose current and future FME cell wear and generate a leveling strategy and various triggering operational events to manage how wear impacts data storage performance.

Although not required or limiting, the leveling module 230 can input past logged performance of FME memory cells, current detected performance of FME memory cells, how the FME memory cells are configured and calibrated, past and current error/failure rate of FME memory cells, pending data access commands to the FME memory cells, and power consumption for assorted data read and write operations to determine the current health of one or more FME memory cells and generate strategies that mitigate, prevent, and/or repair the health of at least one memory cell. The controller 232 can operate alone, or in combination with other module 230 circuitry, to translate the various input information into the current health of memory cells and the assorted strategies.

A monitor circuit 234 can be used to track data access operations and performance of at least one memory cell to detect deviations from healthy FME memory cell operation without the presence of a wear condition, such as the conditions of FIGS. 4A-4C. The monitor circuit 234 can correlate experienced errors, cell access latency, and heat to a suspicion of FME cell health degradation and, possibly, a particular wear condition being present. It is contemplated that the monitor circuit can track activity to FME cells with dynamic resolution in response to detected errors, heat, and deviation from expected access latency. Such dynamic resolution may track cell activity with other cells of a die/plane/block/page in a first resolution before honing in on a particular cell address or page in a tighter second resolution.

The ability to adjust how and what activities are tracked by the monitor circuit 234 allows the controller 232 to control the volume of processing power and time that is consumed with trying to ascertain the health of FME memory cells. Adjustment of system resources being consumed further allows data addresses storing sensitive data to be tracked with tighter resolution than other addresses storing less sensitive data. The monitor circuit 234 can correlate current, real-time data access operations and performance with the reference voltages, latencies, and error rates set by the controller 232 to determine if a health related deviation is occurring. That is, the controller 232 can generate one or more wear hypothetical parameters that correspond deviations from expected operating conditions to FME wear conditions.

While the controller 232 can operate with the monitor circuit 234 to set, and adjust, the reference voltages to satisfy pending data access requests with data read and/or write operations, some embodiments generate deliberate operational alterations to test and/or verify the presence of a deviation in health for an FME memory cell. For instance, the controller 232 can prescribe using reference voltages for reading and/or writing data that allows for the determination that a cell has degraded health and/or a wear condition. It is noted that the deliberate operational alterations can be conducted to satisfy pending data access requests, but with less than maximum performance, such as lower latency and/or greater production of heat.

In non-limiting embodiments of the leveling module 230, the controller 232 prescribes a plurality of different deliberate operational alterations for the leveling strategy to allow for the detection and characterization of FME memory cell health degradation as well as the prediction of future health degradation with a prediction circuit 236. It is contemplated that the controller 232 can prescribe specific, non-operational deliberate alterations to FME cell parameters to conclusively identify and characterize health degradation. However, the non-operational testing may be reserved for particularly drastic wear conditions and the leveling module 230 may attempt to keep using operational alterations that can satisfy host-generated data access requests so that a host does not experience a lag or pause in the operation of a memory.

The prediction circuit 236 may operate to translate current and/or past FME memory cell operating conditions into future operating conditions, parameters, and health degradation. One or more wear strategies can be populated by the prediction circuit 236 with several different predicted health degradations corresponding to changes in FME memory cell operation. For example, the prediction circuit 236 can forecast how different changes in FME operation, such as with different read latency, error rate, heat generation, and write latency, can indicate health degradation and, potentially, the presence of a particular wear condition. Such correlation of FME memory cell operational deviations with health degradation allows the health strategies to prescribe more intensive testing to verify the presence of health degradation and/or actions to mitigate and/or repair the health degradation without ever conducting a memory cell test that does not service a pending data access request.

In the event the leveling module 230 wants to test an FME memory cell other than during the satisfaction of pending data access requests, the controller 232 can generate one or more tests to efficiently consume processing power and time to determine the presence and type of health degradation. That is, once the controller 232 identifies that a health degradation may be present by altering the operating characteristics during the satisfaction of host-generated data access requests, one or more tests from the controller 232 can verify and characterize any health degradation by taking some, or all, of an FME memory offline temporarily as artificial test patterns generated by the controller 232 are used to plot some, or all, of a hysteresis loop for an FME memory cell.

Through the intelligent use of deviating operational FME memory cell parameters to indicate health degradation and cell conducing health tests generated by the controller 232, the leveling module 230 can reliably and efficiently determine that the health of particular memory cells has changed. Either when health degradation is expected or verified, the leveling module 230, through the assorted health strategies, can choose to repair or mitigate the change in FME operation and/or capabilities. The prediction of future health degradations may additionally allow the leveling module 230 to prevent a wear condition from occurring and/or becoming permanent.

It is noted that the presence of heat can exacerbate the degradation of cells and the occurrence of some wear conditions. Hence, the leveling module 230 can monitor the volume and presence of heat around assorted FME memory cells. The logging of heat can be useful for other module 230 circuitry to detect current susceptibilities to health degradation and wear conditions as well as accurately predicting future data access operations, patterns, and activity that could threaten, or exacerbate, FME memory cell wear. For instance, the controller 232 can identify physical and logical data addresses where heat is localized in a memory array along with where the generated heat travels to potentially compound data access activity and threaten the health and operating consistency of one or more FME memory cells.

Some embodiments of the leveling module 230 generate various operating stages and wear triggers for FME memory cells to prioritize different memory cell goals over time. A non-limiting example of operating modes consists of a repair mode that takes actions to provide peak memory performance, a mitigation mode that takes actions to provide the longest usable lifespan for memory cells, and a balance mode that takes actions to provide consistent cell wear and operational performance across assorted memory cells.

While not required or limiting, a leveling strategy can be based on current, past, and/or future memory cell configurations and operations to provide a theme, or goal, for memory cell performance in response to the presence of memory cell wear. For instance, the leveling module 230 can proactively evaluate at least the logical and physical arrangement of memory cells as well as logged memory cell performance, errors, and power consumption to generate alterations to future memory cell operation that are directed to a theme/goal, such as repairing wear, mitigating the impact of wear, or balancing wear across multiple memory cells.

A leveling strategy can consist of several different actions that alter the operation of memory cells to carry out a goal/theme associated with future memory cell performance. A memory cell repair theme for an operational stage can be directed to correcting cell wear and returning a memory cell to default operational parameters and/or performance. A memory cell wear mitigation theme for an operational stage can be directed to reducing the proliferation of wear, cell performance degradation, or both while a wear balance theme for an operational stage can be directed to providing consistent memory cell wear and/or performance for several memory cells of a page, block, plane, die, or memory. The availability of different themes for memory cell operational stages in response to detected, or predicted, wear allows a module controller 232 to efficiently transition at least one memory cell from a default operational stage that utilize default parameters, such as reference voltage, latency, background operations, and error correction, to stage parameters assigned to effect a particular theme/goal.

A repair operational stage can correspond with logically or physically altering a programmed cell state, such as from 1 to 0 or vice versa, without a host-generated request for such a cell write operation, reordering the execution of pending data access requests, and artificially reading a cell to remove the polarization in the cell. Such cell wear repairing actions over time can reverse imprint, fatigue, and depolarization wear conditions by manipulating the magnetization, heat, and cyclic rate of cell reading and/or writing. It is contemplated that the repair theme for an operational stage can pivot between different cell operational alterations over time in response to detected, or predicted, memory cell wear status before returning to default cell operating parameters once cell wear has been fully corrected. Some embodiments generate new default operating parameters in the event a cell cannot be fully repaired, which can correspond with a hysteresis loop not returning from a degraded shape to a default shape. Such generation of new default operating parameters, such as reference voltage, write power, and number of logical states stored in a single memory cell, can be characterized as recalibration.

Altering the settings/parameters associated with memory cell reading and/or writing may be customized to mitigate further degradation of wear and/or performance associated with wear as part of a mitigation theme for an operational stage. In other words, cell recalibration actions can operate to correct memory cell wear, stop wear from progressively getting worse in at least one cell, or reduce the data access performance degradation resulting from the presence of wear. A mitigation theme for an operational stage may also involve throttling the satisfaction of data access requests to a memory. For example, throttling may artificially slow the execution of data access requests, which may involve inserting time delays, altering clock cycles, or conducting data reads instead of data writes for a predetermined amount of time. The throttling of memory cell operation can involve changing the frequency and/or location of cell background operations, such as error correction, cell refresh, data mapping, and garbage collection.

With several memory cell wear conditions being exacerbated by the presence of heat, such as above 70° C., assorted actions can be executed to manage heat in a memory array. For instance, heat management can involve changing the physical location of data writes, changing the programming voltages and/or time duration of data writes, and caching of data writes so that data reads can be conducted to some portions of a memory array, such as a lower level of a 3D stack of memory cells. While the mitigation of cell wear can increase the longevity and usable lifespan of cells experiencing wear, the peak performance of cells with a wear condition will not return, which contrasts the results of the repair theme for an operational stage. As such, the actions of the mitigation themed operational stage can be directed to maintaining a minimum data access performance for memory cells for an extended amount of time instead of enabling peak cell performance.

It can be appreciated that an operational stage with repair theme actions are directed to providing peak cell performance while mitigation themed operational stage actions are focused on cell operational longevity. However, various hosts can demand memory cell operational consistency, such as in the satisfaction of a service level agreement, quality of service standard, or deterministic window. Such consistency is measured in cell performance variability over time, which is different than peak performance or cell lifespan. That is, the actions of a balance theme for an operational stage can be directed to providing cell operation that is consistent with minimal variation over time instead of maximum possible data access performance. To that end, the operational stage balance theme can move data between different memory cell physical block addresses, repurpose memory cells for different types of data storage, and/or induce wear in memory cells to create a more uniform level of wear in a memory, page, block, plane, or die.

To carry out the movement of data in response to detected, or predicted memory cell wear, a leveling strategy can identify destination physical block addresses. The proactive identification of destination locations for cells experiencing wear, such as imprint, fatigue, and depolarization, allows for efficient transition of data and mitigation of wear in the initially written memory cell. The movement of data can correspond with an initially written memory cell being assigned an unavailable designation so that the wear present in the memory cell does not get worse. It is contemplated that a worn cell that has had data moved to a different memory cell can be programmed to a polarization that prevents exacerbation of existing wear, such as a zero polarization or fraction of an opposite polarization of the previously written data.

Repurposing memory cells can involve altering the type, size, or security of data being stored in a memory cell.

Repurposing may also involve changing how a memory cell operates, such as utilizing cells for long-term storage, short-term cache storage, multi-level pair of logical states, or single level pair of logical states. The use of cell repurposing can change the volume of data reads and/or writes to a memory cell and the type of repurposing can be chosen with respect to the type and severity of cell wear to prevent future cell wear. For instance, an imprint wear condition may prompt a repurposing that involves long-term storage of data while a depolarization wear condition may prompt a repurposing of a memory call as backup cache short-term storage.

While mitigating the proliferation of wear in cells experiencing a wear condition can balance wear across a memory as other memory cells experience health degradation and wear over time. However, such wear balancing by slowing, or stopping, wear proliferation can be relatively slow and involve consistent alterations to cell operation, which consumes higher than average amounts of system processing power and capability. Hence, some embodiments of wear balancing conduct actions to actually induce wear in one or more memory cells. For example, non-requested data reads and/or writes can be conducted on cells to concentrate heat and/or cause health degradation, such as depolarization, imprint, and fatigue conditions.

The ability to choose between different actions to carry out a stage theme along with the ability to change to different themes and stages allows for dynamic and intelligent management of detected, or predicted, wear. Through the proactive generation of a leveling strategy that prescribes various themes that respectively comprise assorted operational changes that can be conducted to repair wear, mitigate wear, or balance wear, memory cell health degradation can be quickly controlled and managed to maintain data storage performance, such as average data access latency, error rate, or average power consumption.

A schedule circuit 238 can provide the leveling module 230 with one or more operational stage progressions corresponding with different levels of detected, or predicted, wear. The schedule circuit 238, in some embodiments, can proactively create different operational stage progressions, potentially with different wear triggers, for individual memory cells or groups of memory cells, such as physical blocks, physical die, logical garbage collection units, or logical namespaces. Such operational stage progressions can be based on previously logged data access activity and/or performance, with customizes the stage progressions to provide the greatest longevity for peak performance and memory cell usable lifespan. It is contemplated that the schedule circuit 238 sets singular goals throughout memory cell wear, such as peak performance, access latency consistency, or lifespan, with a customized progression of different operational parameter alterations prompted by preset triggers.

An adaptation circuit 240 can complement the other module 230 circuitry by evaluating if current leveling strategy cell wear progressions are optimal for current system conditions as well as predicted future system conditions. That is, the adaptation circuit 240 can test one or more existing memory cell operational stage progressions from a leveling strategy to ensure the progression, actions called for in the respective stages, and the wear triggers all provide the best possible conformance to a goal (performance/lifespan/consistency) for current and predicted memory operating conditions. In the event a stage progression is not ideal, or if the goal for a memory cell has changed, the adaptation circuit 240 can suspend the leveling strategy for at least one memory cell while the schedule circuit 238 prepares changes to the identified stage progression.

While not required, the leveling module 230 can employ a test circuit 242 to conduct wear testing when passive wear determination with the monitor circuit 234 is insufficient and/or inconclusive. The test circuit 242 may be triggered by a variety of operational degradation, such as a threshold error rate, or by identified opportunities to determine the health of one or more memory cells, such as system standby times, software initiation, low data access request queue volume, or low power consumption periods. As a result of various memory cell reading and writing of patterns generated by the test circuit 242, the hysteresis loop can be plotted, which provides the real-time current health of a memory cell when compared to a default hysteresis loop shape and size.

The leveling module 230 can conduct dynamic management of memory cell operating stages in response to various operating events, such as identified heat accumulation, cell access errors, deviations from cell performance defaults, and changes in connected hosts. The proactive generation and management of assorted operating stages allows for efficient reactions to encountered memory operations and events as the controller 232 does not have to generate altered operating parameters in reaction to an event that triggers a change in operating mode for portions of a memory. It is noted that multiple different stages may concurrently be executed by the leveling module 230 on different memory cells, which may produce separate memory cells, pages, planes, blocks, or die operating with different alterations from default FME memory cell operating parameters.

The use of independent circuitry, instead of handling all operating stage generation and execution with a single circuit or controller, allows for testing of existing, and potential, stage actions and/or operational parameters to current, and predicted, memory conditions. Such testing may be conducted virtually, with the prediction circuit 236, or with actual memory cell access to ensure that the prescribed operational alterations corresponding to a mode have a good chance of successfully enacting the desired result. It is contemplated that the leveling module 230 can rank and/or prioritize different actions corresponding to a stage in order of a particular metric, such as power consumed, processing power consumed, time to completion, chance of successful change to cell wear, or number of memory cells undergoing the operational change.

Figure 8:
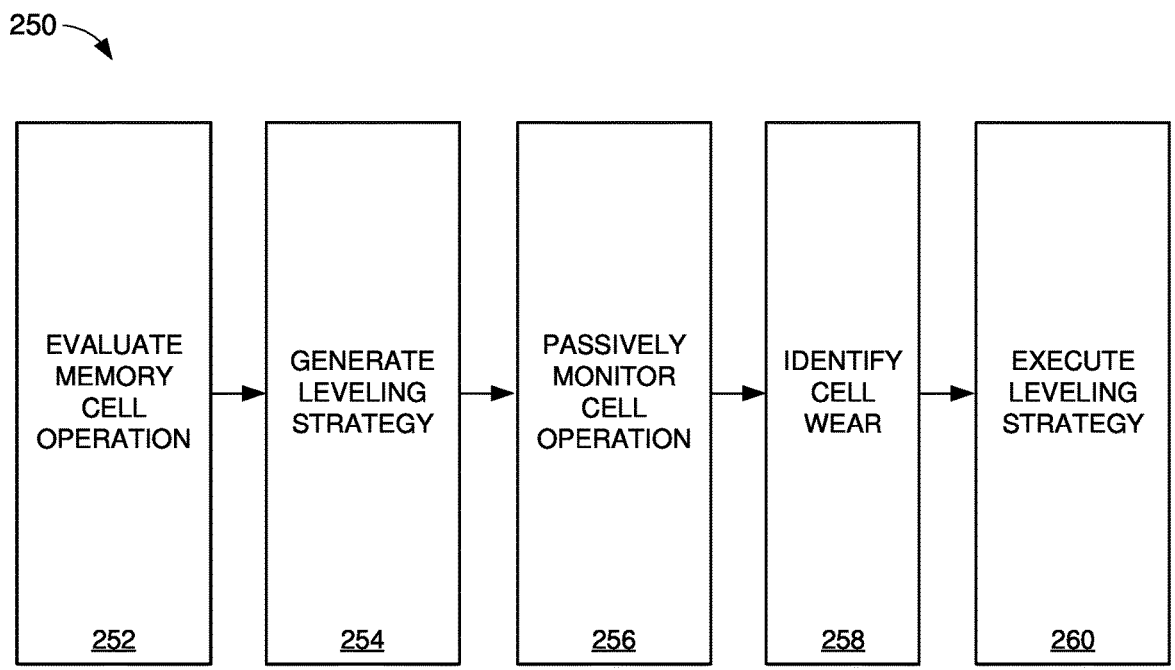
FIG. 8 depicts a block representation of logic that can be practiced with a read destructive memory in accordance with various embodiments.

FIG. 8 depicts a timeline 250 of operation of an example data storage device employing a leveling module in accordance with assorted embodiments. After connection of a leveling module to an array of memory consisting of read destructive memory cells, such as ferroelectric cells, memory cell operation is evaluated in step 252 along with the system settings, default memory cell operating parameters, and cell logical configuration. The evaluation allows the leveling module to generate separate wear stage progressions in step 254 as part of a leveling strategy for different memory cells, or groups of cells. Such stage progressions can involve different goals, operating parameter alterations, and wear triggers that are customized to a particular memory resolution, such as by memory cell, page of cells, die of cells, or namespace, to manage wear and level the operational degradation of memory cells over time.

Once the leveling strategy is populated with an operational stage progression for at least one memory cell, step 256 passively monitors cell operation to determine the type and severity of wear. The passive monitoring of a memory cell in step 256 can consist of altering the data reading and/or data writing parameters during the satisfaction of host-generated data access requests. In other words, the passive monitoring of wear in step 256 maintains memory cells in operational mode and without a dedicated wear test and, instead, determines health degradation and wear based on how memory cell performance is impacted by slightly modifying read and/or writing parameters during the satisfaction of host-generated data access requests.

An identification of cell wear in step 258, which can be actual, current wear or wear predicted by the leveling module, prompts execution of the leveling strategy in step 260 where prescribed default memory cell operating parameters are adjusted in stages corresponding with the degree of cell wear deviation from default hysteresis loop size and shape. The creation and execution of prescribed operational stages customized for different levels of memory cell wear based on current and/or predicted system conditions for the memory cell experiencing wear ensures that operational parameter alterations have the best chance of repairing wear, mitigating the proliferation of wear, balancing wear, or prolonging cell lifespan. The prescription of customized wear stage schedules for assorted portions of a read destructive solid-state memory contrasts a generic wear protocol conducted on memory cells without any customization for past cell performance, predicted system conditions, or dynamic operating parameter goals prompted by different levels of detected wear.

It is noted that a leveling module can diagnose one or more memory cells of a page as experiencing a wear condition currently, or is going to experience a wear condition at the conclusion of a future event, such as satisfaction of a pending data access request or operation in the presence of heat above a set threshold. The diagnosing of current, of future, wear in a memory cell prompts the leveling module to evaluate and assign an operational mode to the page to manage the wear.

The leveling module, in some embodiments, concurrently diagnoses different portions of memory with different wear conditions that are assigned different operational stages. The leveling module can identify, proactively or reactively, that a first page of memory has a depolarization wear condition while a second page of memory has a fatigue wear condition and a third page of memory has an imprint wear condition. Although memory cells of a single page can experience different wear conditions simultaneously, the leveling module can choose to execute one or more operational modes for a page of memory experiencing more than one wear condition. That is, the leveling module may conduct different wear stages, and consequential stage operational parameter deviations actions, for any logical or physical portion of a memory, such as particular memory cells, pages of memory cells, or die of pages, which corresponds with the leveling module and operational modes having a dynamic resolution from memory cell-level to die-level.

Over time, the leveling module can adapt the assigned operational stage and/or deviation from default cell operational parameters prescribed by a leveling strategy in response to the performance of the memory as well as the needed capabilities to satisfy pending host-generated requests. For instance, the leveling module can alter a stage for a page of memory cells, alter the operational parameters executed on memory cells, or suspend a stage to return memory to a default, non-wear operational parameters so that a memory can satisfy one or more requests with sufficient performance, such as access latency, error rate, latency variability, or time to completion. The ability to alter or suspend an operational stage can be complemented by the ability to conduct different stage, or actions prescribed to a stage, concurrently on a portion of memory, such as a page, block, plane, or die. In other words, the proactive generation of the leveling strategy that prescribes assorted stages and operational deviations to carry out the wear goal of the stage allows the leveling module to intelligently and dynamically implement one or more modes and mode actions to efficiently manage the actual, or predicted, wear of memory cells.

Figure 9:
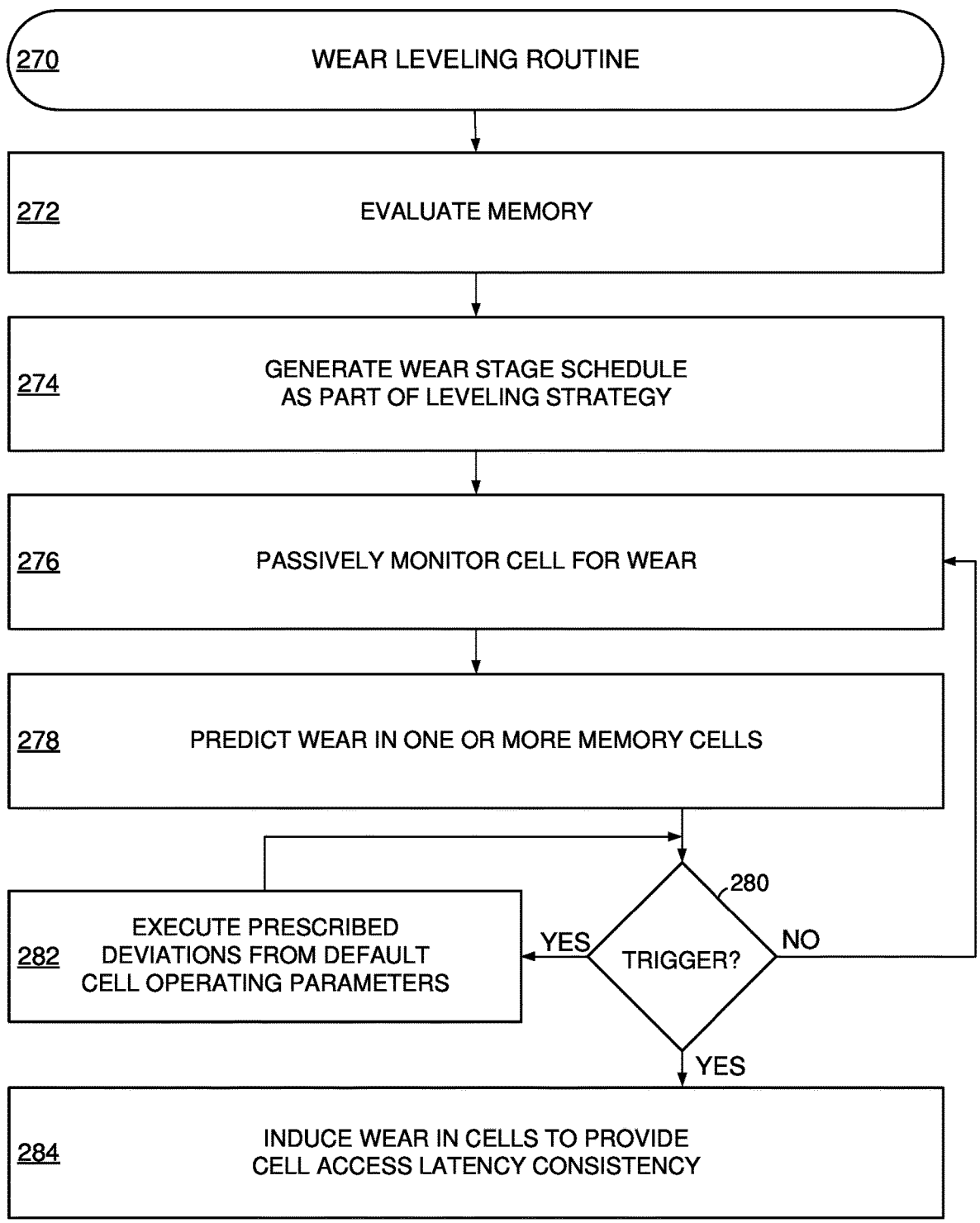
FIG. 9 is a flowchart of an example wear leveling routine that may be carried out in embodiments of a memory employing read destructive memory cells.

FIG. 9 is a flowchart of an example wear leveling routine 270 that can be carried out by the assorted embodiments of a leveling module connected to an array of solid-state non-volatile read destructive memory cells, such as ferroelectric memory cells. Initially, the leveling module evaluates assorted aspects of memory in step 272, such as cell configuration, default cell operating parameters, default cell hysteresis loop configuration, and processing capability of a data storage system, to generate at least one wear stage schedule in step 274 to manage the occurrence of wear in at least one memory cell without degrading data access performance to the memory cell.

The wear stage schedule can have any number of different stages with dynamic objectives and associated deviations from default cell operating parameters. It is contemplated that a wear stage schedule is proactively generated in step 274 as part of a leveling strategy prior to any wear existing in a memory cell. A leveling strategy can have numerous different wear stage schedules customized for different individual memory cells, or groups of memory cells, that allow for efficient execution in response to detected or predicted memory cell health degradation, deviation from a default hysteresis loop shape/size, and existence of a cell wear condition. It is noted that the leveling strategy can additionally have wear triggers assigned to switch between wear stages and operational parameter deviations from default values.

The generation of the leveling strategy in step 274 allows the leveling module to monitor memory cell performance, operational parameters, and host-generated data access requests over time in step 276 to determine the current presence, or predicted occurrence, of memory cell health degradation and/or a wear condition. In step 276, the leveling module can detect actual and/or future memory cell wear without conducting specific cell tests, such as data writing and/or data reading, and, instead, by monitoring cell activity during the satisfaction of data access requests, slightly altering the operating parameters during the satisfaction of host-generated requests, and identifying changes to the default hysteresis loop for at least one memory cell, which can be characterized as passive wear testing.

The monitoring memory cell activity and determining the current or future presence of cell wear in step 276 can involve the leveling module logging data access activity over time. The logged activity can prompt the leveling module to initiate artificial deviations from default data access parameters to test for memory cell health degradation and the presence of a wear condition. The logged activity may further be utilized by the leveling module to characterize the type of wear in a memory cell, predict future memory wear, and evaluate different wear management goals to determine how best to conduct the prescribed wear stage schedule. That is, the leveling module can verify that prescribed wear management goals, such as peak performance, consistency, or lifespan, prescribed in the leveling strategy are likely results for prescribed deviations from cell default operating parameters.

Through the passive monitoring of data accesses in the satisfaction of host-generated data access requests, either unmodified or modified by the leveling module to test for wear, the leveling module can predict in step 278 that the hysteresis loop of at least one memory cell is, or will be, altered as part of a wear condition. Such predicted wear may correspond with the current existence of a wear condition, but the condition may not be verified due to the lack of a full test of a memory cell to map the current hysteresis. Hence, the leveling module, through the execution of step 276, can accurately predict memory cell wear without a dedicated wear test involving memory cell access and instead based on memory cell response to module-generated slight deviations in data access parameters during the satisfaction of host-generated data access requests.

As a result of the health degradation and cell wear discovered by the leveling module, the leveling module can determine in decision 280 if wear has reached a predetermined trigger threshold. In the event that cell wear is below a threshold value, routine 270 returns to step 276 where passive monitoring of cell health is conducted to determine health degradation and/or wear conditions. Conversely, the detection or prediction of memory cell above a predetermined wear trigger threshold prompts step 282 to execute prescribed deviations from default memory cell operating parameters to carry out the predetermined wear stage goal, such as health repair or wear balancing with respect to other memory cells.

Once the prescribed default operating parameter deviations for at least one cell are initiated, the leveling module returns to decision 280 where cell wear is again evaluated with respect to wear triggers of the leveling strategy. In response to a new wear trigger being met, step 282 is again executed to carry out a different wear stage, which corresponds with different deviations from default operating parameters and a different stage goal. It is contemplated that decision 280 prompts a memory cell to return to default operating parameters if operating actions have repaired a cell's health below a lowest wear trigger.

However, a determination in decision 280 that wear has exceeded a highest threshold trigger value prompts step 284 to balance wear across multiple different cells in an effort to provide maximum possible cell access latency consistency, which can be used to provide guaranteed data read performance, such as in a deterministic window or to satisfy a service level agreement, despite the presence of relatively high levels of health degradation and wear. Balancing wear across multiple memory cells can be achieved with a variety of different deviations from default cell operating parameters, but in some embodiments involves artificially conducting actions to induce wear in one or more memory cells.

For instance, data access requests can be reordered and/or leveling module generated data writes and/or reads can be conducted to a cell to deliberately cause a selected wear condition that provides the most consistent data access latency consistency for host-generated data access requests. Although not required, the inducing of wear in step 284 can correspond with the leveling module changing the type of wear present in a memory cell. That is, the leveling module can execute one or more artificial memory cell accesses to change a first wear condition, such as fatigue, imprint, or depolarization, to a different second wear condition that conforms to better data access consistency and/or minimum latency variability.

The leveling module, during the execution of the assorted actions associated with the respective operational stages, can evaluate the resulting memory cell performance of one or more memory cells to determine if the executed actions are producing the desired results, such as balancing wear, mitigating wear proliferation, or repairing a cell's hysteresis loop. If the executed actions are not optimally carrying out the chosen operational stage goal, the leveling module can alter the operational stage, stage trigger, and/or stage deviation from default operating parameters prescribed by the leveling strategy to provide a better conformance with the chosen operational stage while providing the best possible data access performance during the satisfaction of host-generated data access requests. That is, the leveling module can determine if the current stage actions are the best actions from the leveling strategy to provide the wear stage goal without degrading real-time current data access performance.

Figure 10:
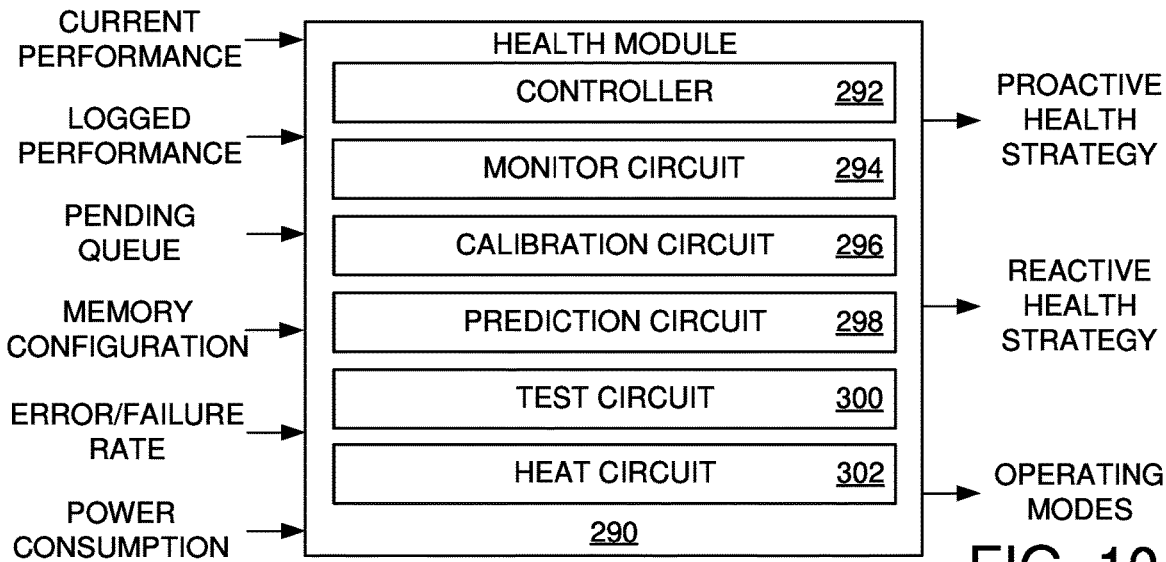
FIG. 10 displays a block representation of an example health module that may be employed in assorted embodiments of a wear leveling system.

FIG. 10 depicts a block representation of an example health module 290 that can be present as software and/or hardware in a data storage device, in a network component, such as a server or node, or in a remote host. The module 290 can employ one or more controllers 292 that translate assorted input information into at least a proactive health strategy, a reactive health strategy, and at least two FME cell operating modes. That is, a controller 292, such as a microprocessor or other programmable circuitry, can diagnose current and future FME cell wear and generate health strategies to mitigate and/or prevent cell wear conditions.

Although not required or limiting, the health module 290 can input past logged performance of FME memory cells, current detected performance of FME memory cells, how the FME memory cells are configured and calibrated, past and current error/failure rate of FME memory cells, pending data access commands to the FME memory cells, and power consumption for assorted data read and write operations to determine the current health of one or more FME memory cells and generate strategies that mitigate, prevent, and/or repair the health of at least one memory cell. The controller 292 can operate alone, or in combination with other module 290 circuitry, to translate the various input information into the current health of memory cells and the assorted strategies.

A monitor circuit 294 can be used to track data access operations and performance of at least one memory cell to detect deviations from healthy FME memory cell operation without the presence of a wear condition, such as the conditions of FIGS. 4A-4C. The monitor circuit 294 can correlate experienced errors, cell access latency, and heat to a suspicion of FME cell health degradation and, possibly, a particular wear condition being present. It is contemplated that the monitor circuit can track activity to FME cells with dynamic resolution in response to detected errors, heat, and deviation from expected access latency. Such dynamic resolution may track cell activity with other cells of a die/plane/block/page in a first resolution before honing in on a particular cell address or page in a tighter second resolution.

The ability to adjust how and what activities are tracked by the monitor circuit 294 allows the controller 292 to control the volume of processing power and time that is consumed with trying to ascertain the health of FME memory cells. Adjustment of system resources being consumed further allows data addresses storing sensitive data to be tracked with tighter resolution than other addresses storing less sensitive data. The monitor circuit 294 can correlate current, real-time data access operations and performance with the reference voltages, latencies, and error rates set by a calibration circuit 296 to determine if a health related deviation is occurring. The calibration circuit 296 can generate one or more wear hypothetical parameters that correspond deviations from expected operating conditions to FME wear conditions.

While the calibration circuit 296 can set, and adjust, the reference voltages to satisfy pending data access requests with data read and/or write operations, some embodiments of the calibration circuit 296 generate deliberate operational alterations to test and/or verify the presence of a deviation in health for an FME memory cell. For instance, the calibration circuit 296 can prescribe using reference voltages for reading and/or writing data that allows for the determination that a cell has degraded health and/or a wear condition. It is noted that the deliberate operational alterations can be conducted to satisfy pending data access requests, but with less than maximum performance, such as lower latency and/or greater production of heat.

In non-limiting embodiments of the health module 290, the calibration prescribes a plurality of different deliberate operational alterations for the respective health strategies to allow for the detection and characterization of FME memory cell health degradation as well as the prediction of future health degradation with a prediction circuit 298. It is contemplated that the calibration circuit 296 can prescribe specific, non-operational deliberate alterations to FME cell parameters to conclusively identify and characterize health degradation. However, the non-operational testing may be reserved for particularly drastic wear conditions and the health module 290 may attempt to keep using operational alterations that can satisfy host-generated data access requests so that a host does not experience a lag or pause in the operation of a memory.

The prediction circuit 298 may operate to translate current and/or past FME memory cell operating conditions into future operating conditions, parameters, and health degradation. One or more health strategies can be populated by the prediction circuit 298 with several different predicted health degradations corresponding to changes in FME memory cell operation. For example, the prediction circuit 298 can forecast how different changes in FME operation, such as with different read latency, error rate, heat generation, and write latency, can indicate health degradation and, potentially, the presence of a particular wear condition. Such correlation of FME memory cell operational deviations with health degradation allows the health strategies to prescribe more intensive testing to verify the presence of health degradation and/or actions to mitigate and/or repair the health degradation without ever conducting a memory cell test that does not service a pending data access request.

In the event the health module 290 wants to test an FME memory cell other than during the satisfaction of pending data access requests, a test circuit 300 can generate one or more tests to efficiently consume processing power and time to determine the presence and type of health degradation. That is, once the controller 292 identifies that a health degradation may be present by altering the operating characteristics during the satisfaction of host-generated data access requests, one or more tests from the test circuit 300 can verify and characterize any health degradation by taking some, or all, of an FME memory offline temporarily as artificial test patterns generated by the test circuit 300 are used to plot some, or all, of a hysteresis loop for an FME memory cell.

Through the intelligent use of deviating operational FME memory cell parameters to indicate health degradation and cell conducing health tests generated by the test circuit 300, the health module 290 can reliably and efficiently determine that the health of particular memory cells has changed. Either when health degradation is expected or verified, the health module 290, through the assorted health strategies, can choose to repair or mitigate the change in FME operation and/or capabilities. The prediction of future health degradations may additionally allow the health module 290 to prevent a wear condition from occurring and/or becoming permanent.

It is noted that the presence of heat can exacerbate the degradation of cells and the occurrence of some wear conditions. Hence, the health module 290 can employ a heat circuit 302 that monitors the volume and presence of heat around assorted FME memory cells. The logging of heat by the heat circuit 302 can be useful for other module 290 circuitry to detect current susceptibilities to health degradation and wear conditions as well as accurately predicting future data access operations, patterns, and activity that could threaten, or exacerbate, FME memory cell wear. For instance, the heat circuit 302 can identify physical and logical data addresses where heat is localized in a memory array along with where the generated heat travels to potentially compound data access activity and threaten the health and operating consistency of one or more FME memory cells.

Some embodiments of the health module 290 generate various operating modes for FME memory cells to prioritize different performance over time. A non-limiting example of operating modes consists of altering default memory cell operating parameters, such as voltage, timing, queued request execution order, garbage collection, and error correction, to provide maximum read performance, maximum write performance, maximum cell longevity, maximum cell reliability, and maximum cell access consistency over time. The health module 290 can generate and modify the operating modes available for execution over time as well as what parameters are adjusted and how the parameters are adjusted to provide the respective mode goals.

The dynamic management of operating modes can be conducted by the health module 290 in response to various operating events, such as identified heat accumulation, cell access errors, deviations from cell performance defaults, and changes in connected hosts. The proactive generation and management of assorted operating modes by the health module 290 allows for efficient reactions to encountered memory operations and events as the controller 292 does not have to generate altered operating parameters in reaction to an event that triggers a change in operating mode for portions of a memory. It is noted that multiple different modes may concurrently be executed by the health module 290, which may produce separate memory cells, pages, planes, blocks, or die operating in different modes with different alterations from default FME memory cell operating parameters.

Figure 11:
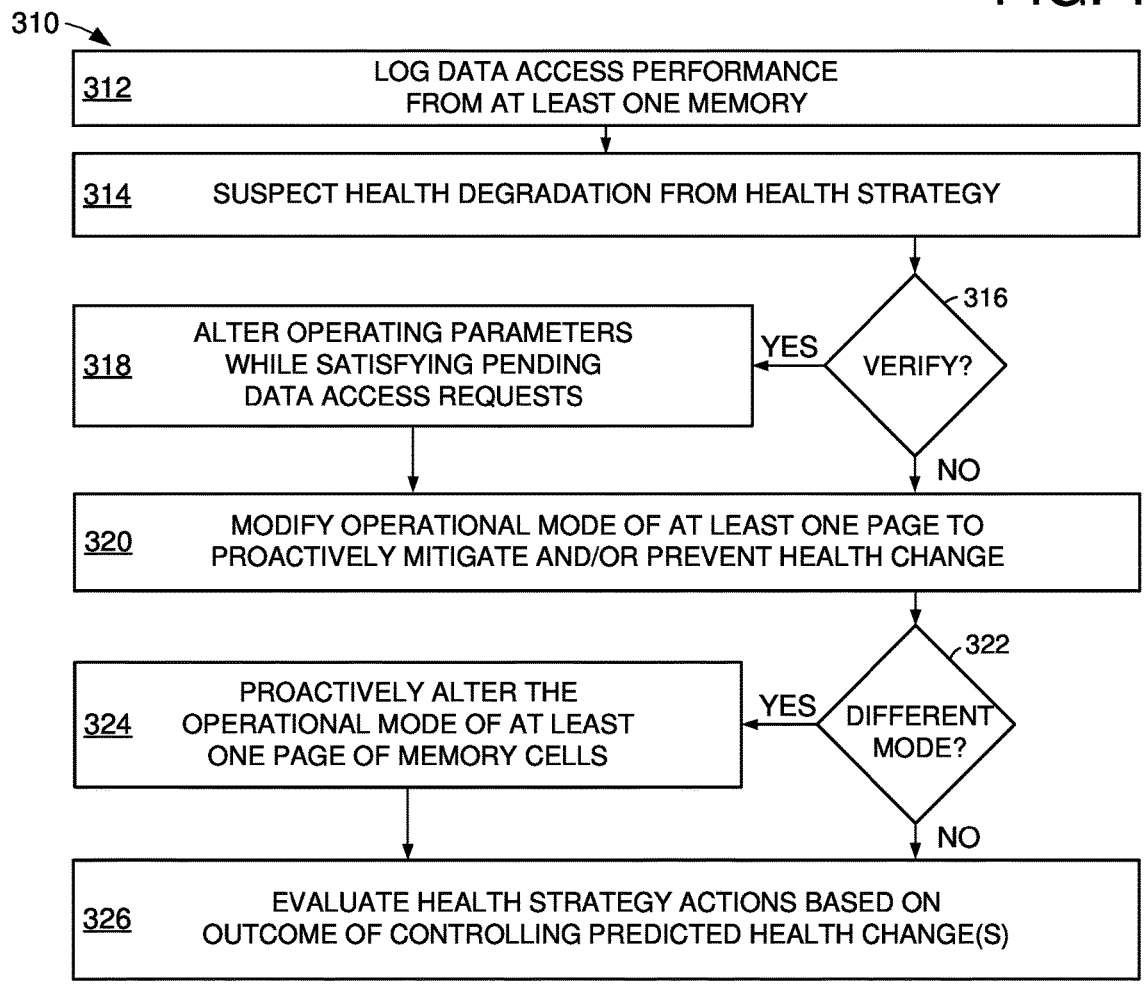
FIG. 11 depicts an example proactive health routine that can be executed with a wear leveling system in accordance with some embodiments.

FIG. 11 is a flowchart of an example proactive health monitoring routine 310 that can be carried out with assorted embodiments of FIGS. 1-10. At least one non-volatile memory employing FME memory cells is connected to a health module that monitors cell activity over time, such as data writes, data reads, and background cell operations initiated by a remote host or a local data storage device controller. The FME memory cell activity is compared by the health module to default cell operating parameters in step 312 to detect an alteration in how at least one cell is operating. For instance, the health module can identify that a single memory cell, logical grouping of cells, or physical grouping of cells are operating with different read latency, write latency, error rate, power consumption, or garbage collection frequency than expected from default operating parameters set during cell manufacturing and/or set by the health module as baseline and/or optimal values.

The detected deviation of memory cell operation from one or more baseline/default values prompts the health module to suspect that certain physical, and the corresponding logical, addresses have experienced wear and/or health degradation that alters the hysteresis loop of the respective FME memory cell(s). The health module may consult one or more previously generated health strategies to quickly correlate deviations in memory cell operation to actual, or predicted, cell health degradation. In a non-limiting example, the health module predicts, in step 314, the type, longevity, and/or severity of the health degradation associated with the detected deviation from step 312.

The health degradation can be accepted or verified with decision 316, which can involve conducting one or more test operational patterns in step 318 generated by the health module to confirm that a hysteresis loop of at least one memory cell has been altered. It is noted that the test operational patterns utilized in step 318 can conduct data writes, data reads, cell refreshes, and/or power monitoring over time to construct the real-time, current hysteresis loop for one or more FME memory cells. The artificial test of step 318 may be executed alone or in combination with the satisfaction of existing host-generated data access requests and/or memory background operations, such as garbage collection, journaling, error correction, or metadata management.

With detected, or predicted, health degradation in one or more memory cells verified in step 318 or assumed from decision 316 without a verification procedure, step 320 modifies an operational mode of at least one page of memory cells to proactively mitigate the effects of cell health degradation, such as excess power consumption, error rate, and/or access latency, or prevent such effects from occurring. It is contemplated that step 320 changes from a default operational mode with a first set of cell calibrations, such as reference voltages, refresh frequency, and cell polarization duration, to a different second set of calibrations directed at another theme chosen by the health module.

Some embodiments direct operational modes to be directed to maximum data access performance, which may involve operational parameters that provide the fastest possible data read, or data write, latency along with the lowest possible error rate. Other, non-limiting, operational mode embodiments are directed to maximum memory cell life, which can utilize operational parameters that reduce power consumption and distribute logical data addresses to a variety of physical addresses in a memory. The health module, in step 320, may pivot to an operational mode directed to repair FME memory cell health, which may involve logically, or actually, altering the polarization of memory cells, distributing cell operation to manage heat, and/or reading from a cache instead of reading from FME memory cells. It is noted that step 320 may operated at any resolution, such as by page, block, plane, die, or memory array as a whole.

An operational mode may be conducted for any length of time while decision 322 evaluates if a different mode can optimize data storage performance over time. While decision 322 can evaluate changes in operational mode that can alter existing memory cell conditions, various embodiments focus decision 322 on proactive FME memory cell mode changes that can prevent, or at least mitigate, health degradation predicted by the health module. Such proactive operational mode changes are carried out in step 324 and can be conducted for any volume of memory cells, such as individual cells, page of cells, or die of cells. The use of predetermined sets of operational parameters corresponding with operational mode themes can allow different pages, blocks, planes, and die of FME memory cells to conduct different modes concurrently, which can optimize memory cell performance without jeopardizing the health of memory cells.

Although decision 322 can cyclically be conducted to alter memory cell operational modes any number of times, step 326 can evaluate one or more health strategies to determine effectiveness and efficiency. Step 326 can evaluate the outcome of previously executed operational modes and/or health degradation mitigation/prevention/repair actions from one or more health strategies to determine if an alteration to a health strategy and/or operational mode can improve the control and/or prevention of FME memory cell health degradation. Through the execution of routine 310, assorted FME memory cells can be utilized with minimal health degradation over time due to the proactive operational mode execution and adaptation to current, and predicted, data access requests, heat, and memory cell wear.

Figure 12:
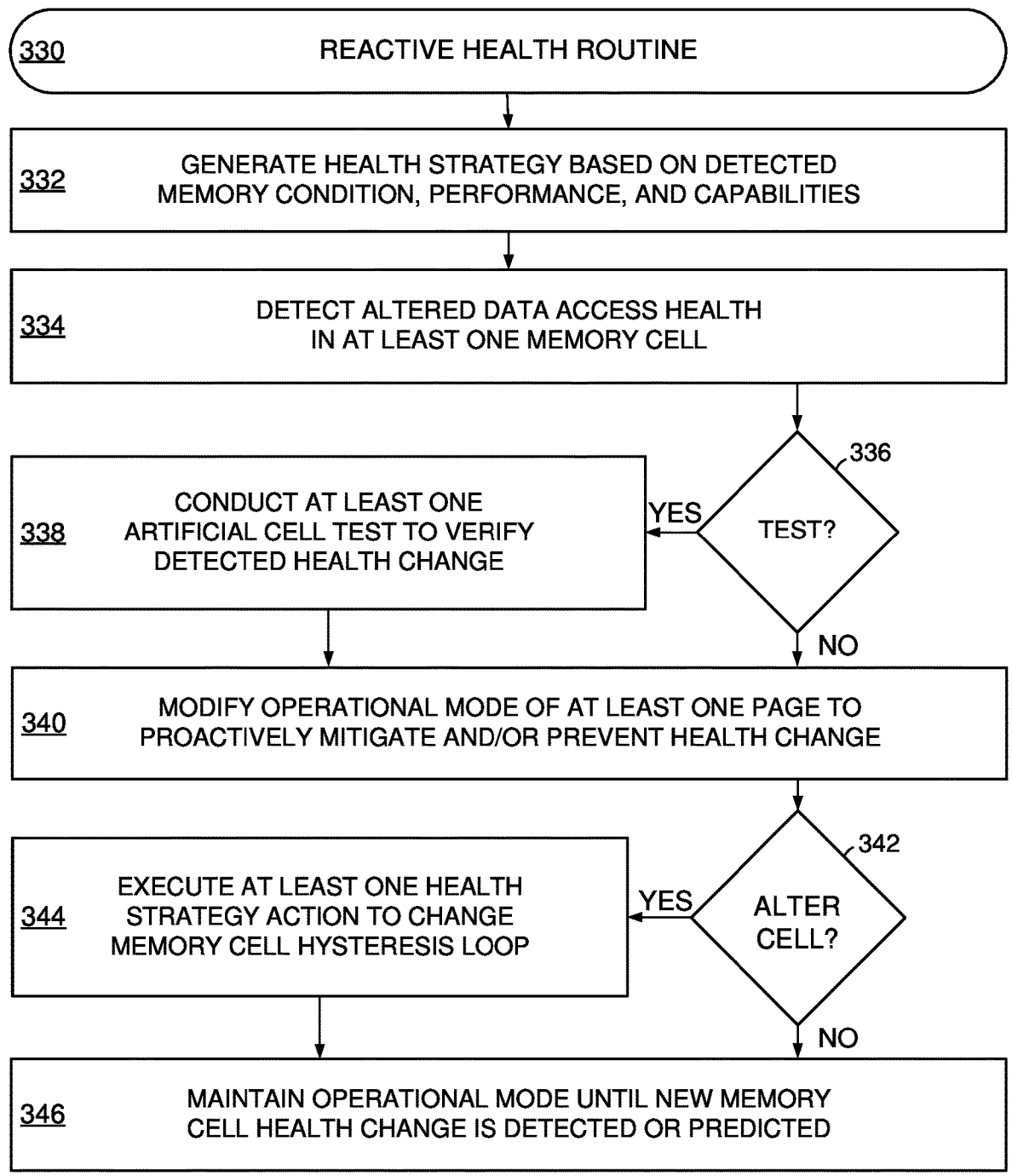
FIG. 12 conveys an example reactive health routine that may be carried out with a wear leveling system in accordance with various embodiments.

However, the health module may also carry out health strategies to reactively optimize FME memory cell operation despite the presence of health degradation. FIG. 12 is a flowchart of an example reactive routine 330 that can be carried out in FME memory cells resident in one or more data storage devices. Initially, step 332 generates at least one health strategy with a health module based on detected memory conditions, performance, and memory cell capabilities. Such detected memory aspects may be sensed during normal operation and satisfaction of host-generated data access requests or during test patterns executed by the health module to determine how memory cells are currently behaving. The execution of step 332 may result in the health module identifying the current state of various FME memory cells as well as the operational parameters currently used to write and read data so that a health strategy can prescribe actions that deviate from current cell operation to provide health degradation mitigation and/or repair.

Next in step 334, the health module detects an altered health in at least one FME memory cell. Such detection may involve monitoring the satisfaction of host-generated data access requests and/or the execution of one or more test data accesses generated by the health module. Regardless of the source of the memory cell health detection, the health module can respond to the deviation in hysteresis loop by accepting the detection or testing the detection in decision 336. A choice to conduct further testing from decision 256 prompts step 338 to conduct at least one artificial memory cell test generated by the health module to verify the health degradation from step 334. It is contemplated that the testing of step 338 can determine the hysteresis loop and logical state polarization values for one or more FME memory cells through writing, reading, power consumption analysis, and/or error rate analysis.

The testing of at least one memory cell in step 338, or if no artificial cell testing is chosen in decision 336, advances routine 330 to step 340 where an operational mode of at least one memory cell is modified in response to the detected/tested cell health to mitigate the effects of the health degradation on data storage performance and/or repairs the health degradation so that the hysteresis loop of at least one cell returns to a default condition, such as a default margin between logical state polarizations. Step 340, in some embodiments, chooses an operational mode that prevents further health degradation, which may involve moving data to different physical addresses, changing reference write voltages, altering read voltages, skipping error correction, ignoring background cell operations, and/or modifying the programmed state of a cell.

The alteration of an operating mode for individual memory cells, or groupings of multiple memory cells, can produce health degradation mitigation and/or repair over time. However, some embodiments can react to detected cell health degradation by changing the operation of an FME memory cell, as evaluated in decision 342. Step 344 proceeds to conduct one or more actions prescribed by a preexisting health strategy to change the hysteresis loop of at least one FME memory cell. As a non-limiting example, step 344 may concentrate heat near a memory cell, retain a polarization in a memory cell, or artificially reverse polarization in a memory cell to induce artificial wear to change a cell's hysteresis loop.

While counter-intuitive to induce health degradation in response to detected cell wear, step 344 can provide memory cell operational consistency among a page/block/plane/die/device that optimizes overall data storage performance despite greater memory cell wear than has naturally occurred. It is contemplated that step 344 conducts one or more actions to repair cell wear instead of inducing more cell wear. Such repair actions may involve artificially inverting cell polarization, moving data to a different physical address, caching data for retrieval, and reducing the presence of heat around a cell. The alteration of a memory cell may be scheduled by the health module to occur independently or concurrently with the satisfaction of host-generated data access requests, which provides the health module options that allow for minimal data storage performance for a memory despite cell wear reactive actions being carried out.

The operational mode initiated in step 340 may be conducted for any amount of time, such as until memory cells are repaired or health degradation has slowed or ceased. Step 346 operates to maintain the operational mode from step 340 until a new memory cell health change is detected, or predicted, by the health module. The ability to pivot between different operational modes for various portions of a memory allow the health module to intelligently conduct data access operations to satisfy one or more connected hosts while managing health degradation and wear to at least one FME memory cell.

Figure 13:
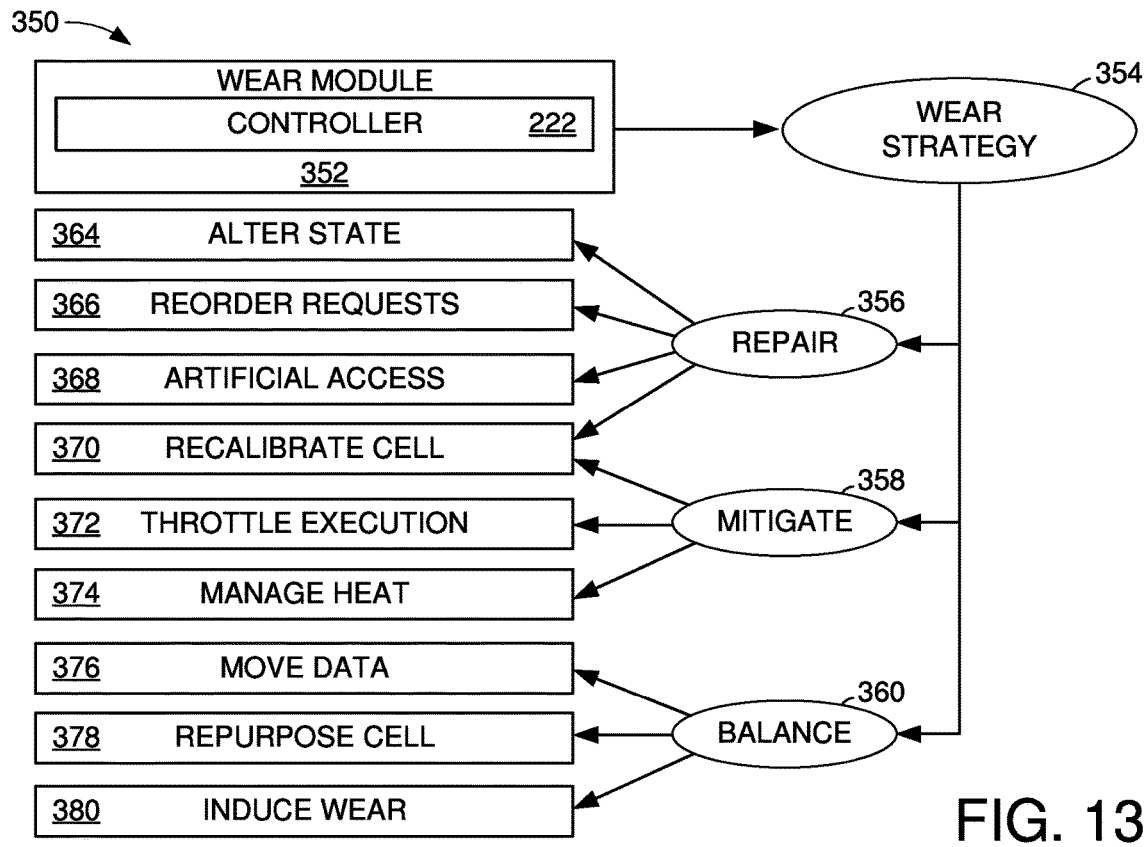
FIG. 13 depicts a block representation of portions of an example data storage system configured and utilized in accordance with some embodiments.

FIG. 13 depicts a block representation of portions of an example data storage system 350 that employs a wear module 352 that generates at least one wear strategy 354 that prescribes actions, and operational memory cell modes, to conduct in response to the presence of memory cell wear. While not required or limiting, a wear strategy can be based on current, past, and/or future memory cell configurations and operations to provide a theme, or goal, for memory cell performance in response to the presence of memory cell wear. For instance, the wear module 352 can proactively evaluate at least the logical and physical arrangement of memory cells as well as logged memory cell performance, errors, and power consumption to generate alterations to future memory cell operation that are directed to a theme/goal, such as repairing wear, mitigating the impact of wear, or balancing wear across multiple memory cells.

As shown, a wear strategy 354 can consist of several different actions that alter the operation of memory cells to carry out a goal/theme associated with future memory cell performance. A memory cell repair 356 theme can be directed to correcting cell wear and returning a memory cell to default operational parameters and/or performance. A memory cell wear mitigation 358 theme can be directed to reducing the proliferation of wear, cell performance degradation, or both while a wear balance 360 theme can be directed to providing consistent memory cell wear and/or performance for several memory cells of a page, block, plane, die, or memory. The availability of different memory cell operational modes in response to detected, or predicted, wear allows a module controller 362 to efficiently transition at least one memory cell from a default operational mode that utilize default parameters, such as reference voltage, latency, background operations, and error correction, to mode parameters assigned to effect a particular theme/goal 356/358/360.

In the non-limiting example of FIG. 13, a repair mode 356 can correspond with logically or physically altering a programmed cell state 364, such as from 1 to 0 or vice versa, without a host-generated request for such a cell write operation, reordering the execution of pending data access requests 366, and artificially reading a cell 368 to remove the polarization in the cell. Such cell wear repairing actions 364/366/368 over time can reverse imprint, fatigue, and depolarization wear conditions by manipulating the magnetization, heat, and cyclic rate of cell reading and/or writing.

It is contemplated that the repair theme 356 can pivot between different cell operational alterations 364/366/368 over time in response to detected, or predicted, memory cell wear status before returning to default cell operating parameters once cell wear has been fully corrected. Some embodiments generate new default operating parameters in the event a cell cannot be fully repaired, which can correspond with a hysteresis loop not returning from a worn shape to a default shape. Such generation of new default operating parameters, such as reference voltage, write power, and number of logical states stored in a single memory cell, can be characterized as recalibration 370.

Altering the settings/parameters associated with memory cell reading and/or writing may be customized to mitigate further degradation of wear and/or performance associated with wear as part of a mitigation theme 358. In other words, cell recalibration actions 370 can operate to correct memory cell wear, stop wear from progressively getting worse in at least one cell, or reduce the data access performance degradation resulting from the presence of wear. A mitigation theme 356 may also involve throttling 372 the satisfaction of data access requests to a memory. For example, throttling may artificially slow the execution of data access requests, which may involve inserting time delays, altering clock cycles, or conducting data reads instead of data writes for a predetermined amount of time. The throttling of memory cell operation 372 can involve changing the frequency and/or location of cell background operations, such as error correction, cell refresh, data mapping, and garbage collection.

With several memory cell wear conditions being exacerbated by the presence of heat, such as above 70° C., assorted actions can be executed to manage heat 374 in a memory array. For instance, heat management can involve changing the physical location of data writes, changing the programming voltages and/or time duration of data writes, and caching of data writes so that data reads can be conducted to some portions of a memory array, such as a lower level of a 3D stack of memory cells. While the mitigation of cell wear can increase the longevity and usable lifespan of cells experiencing wear, the peak performance of cells with a wear condition will not return, which contrasts the results of the repair theme 356. As such, the actions of the mitigation theme 358 can be directed to maintaining a minimum data access performance for memory cells for an extended amount of time instead of enabling peak cell performance.

It can be appreciated that repair theme 356 actions are directed to providing peak cell performance while mitigation theme 358 actions are focused on cell operational longevity. However, various hosts can demand memory cell operational consistency, such as in the satisfaction of a service level agreement, quality of service standard, or deterministic window. Such consistency is measured in cell performance variability over time, which is different than peak performance or cell lifespan. That is, the actions of a balance theme 360 can be directed to providing cell operation that is consistent with minimal variation over time instead of maximum possible data access performance. To that end, the balance theme 360 can move data 376 between different memory cell physical block addresses, repurpose memory cells 378 for different types of data storage, and/or induce wear 380 in memory cells to create a more uniform level of wear in a memory, page, block, plane, or die.

To carry out the movement of data 376 in response to detected, or predicted memory cell wear, a wear strategy 354 can identify destination physical block addresses. The proactive identification of destination locations for cells experiencing wear, such as imprint, fatigue, and depolarization, allows for efficient transition of data and mitigation of wear in the initially written memory cell. The movement of data can correspond with an initially written memory cell being assigned an unavailable designation so that the wear present in the memory cell does not get worse. It is contemplated that a worn cell that has had data moved to a different memory cell can be programmed to a polarization that prevents exacerbation of existing wear, such as a zero polarization or fraction of an opposite polarization of the previously written data.

Repurposing memory cells 378 can involve altering the type, size, or security of data being stored in a memory cell. Repurposing 378 may also involve changing how a memory cell operates, such as utilizing cells for long-term storage, short-term cache storage, multi-level pair of logical states, or single level pair of logical states. The use of cell repurposing can change the volume of data reads and/or writes to a memory cell and the type of repurposing can be chosen with respect to the type and severity of cell wear to prevent future cell wear. For instance, an imprint wear condition may prompt a repurposing that involves long-term storage of data while a depolarization wear condition may prompt a repurposing of a memory call as backup cache short-term storage.

While mitigating the proliferation of wear in cells experiencing a wear condition can balance wear across a memory as other memory cells experience health degradation and wear over time. However, such wear balancing by slowing, or stopping, wear proliferation can be relatively slow and involve consistent alterations to cell operation, which consumes higher than average amounts of system processing power and capability. Hence, some embodiments of wear balancing 360 conduct actions to actually induce wear 380 in one or more memory cells. For example, non-requested data reads and/or writes can be conducted on cells to concentrate heat and/or cause health degradation, such as depolarization, imprint, and fatigue conditions.

The ability to choose between different actions to carry out a theme 356/358/360 along with the ability to change to different themes 356/358/360 allows for dynamic and intelligent management of detected, or predicted, wear. Through the proactive generation of a wear strategy that prescribes various themes 356/358/360 that respectively comprise assorted operational changes that can be conducted to repair wear, mitigate wear, or balance wear, memory cell health degradation can be quickly controlled and managed to maintain data storage performance, such as average data access latency, error rate, or average power consumption.

Figure 14:
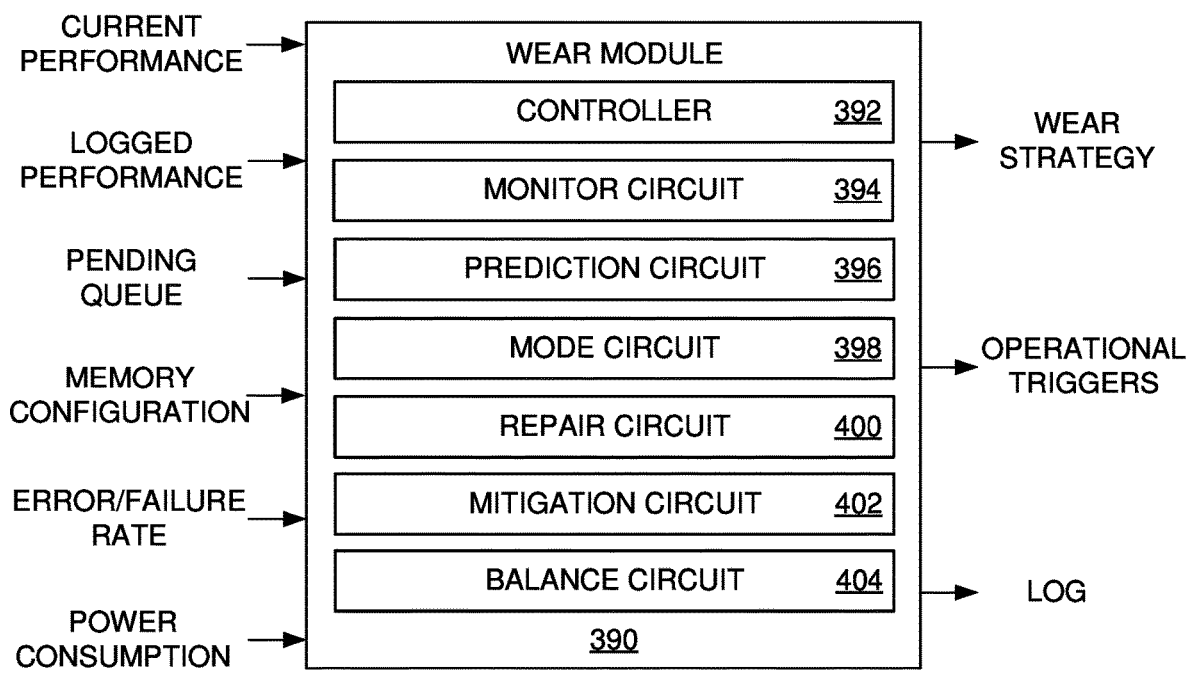
FIG. 14 shows a block representation of an example wear module that can be utilized in a data storage system in assorted embodiments.

FIG. 14 depicts a block representation of an example wear module 390 that can be employed in a data storage device and data storage system in accordance with various embodiments to provide intelligent memory cell wear monitoring and management. The wear module 390 can utilize a controller 392, such as a microprocessor or other programmable circuitry, to evaluate past and current memory conditions, operation, and performance to identify the health of FME memory cells and generate a wear strategy that proactively and/or reactively controls cell wear conditions to increase the performance, longevity, or consistency of memory cell operation despite the presence of memory cell wear.

A wear module 390 that can be present as software and/or hardware in a data storage device, in a network component, such as a server or node, or in a remote host. One or more controllers 392 that translate assorted input information into at least a proactive wear strategy, operational triggers, and one or more logs. That is, a controller 392 can diagnose current and future FME cell wear and generate a wear strategy and various triggering operational events to manage how wear impacts data storage performance.

Although not required or limiting, the wear module 390 can input past logged performance of FME memory cells, current detected performance of FME memory cells, how the FME memory cells are configured and calibrated, past and current error/failure rate of FME memory cells, pending data access commands to the FME memory cells, and power consumption for assorted data read and write operations to determine the current health of one or more FME memory cells and generate strategies that mitigate, prevent, and/or repair the health of at least one memory cell. The controller 392 can operate alone, or in combination with other module 390 circuitry, to translate the various input information into the current health of memory cells and the assorted strategies.

A monitor circuit 394 can be used to track data access operations and performance of at least one memory cell to detect deviations from healthy FME memory cell operation without the presence of a wear condition, such as the conditions of FIGS. 4A-4C. The monitor circuit 394 can correlate experienced errors, cell access latency, and heat to a suspicion of FME cell health degradation and, possibly, a particular wear condition being present. It is contemplated that the monitor circuit can track activity to FME cells with dynamic resolution in response to detected errors, heat, and deviation from expected access latency. Such dynamic resolution may track cell activity with other cells of a die/plane/block/page in a first resolution before honing in on a particular cell address or page in a tighter second resolution.

The ability to adjust how and what activities are tracked by the monitor circuit 394 allows the controller 392 to control the volume of processing power and time that is consumed with trying to ascertain the health of FME memory cells. Adjustment of system resources being consumed further allows data addresses storing sensitive data to be tracked with tighter resolution than other addresses storing less sensitive data. The monitor circuit 394 can correlate current, real-time data access operations and performance with the reference voltages, latencies, and error rates set by the controller 392 to determine if a health related deviation is occurring. That is, the controller 392 can generate one or more wear hypothetical parameters that correspond deviations from expected operating conditions to FME wear conditions.

While the controller 392 can operate with the monitor circuit 394 to set, and adjust, the reference voltages to satisfy pending data access requests with data read and/or write operations, some embodiments generate deliberate operational alterations to test and/or verify the presence of a deviation in health for an FME memory cell. For instance, the controller 392 can prescribe using reference voltages for reading and/or writing data that allows for the determination that a cell has degraded health and/or a wear condition. It is noted that the deliberate operational alterations can be conducted to satisfy pending data access requests, but with less than maximum performance, such as lower latency and/or greater production of heat.

In non-limiting embodiments of the wear module 390, the controller 392 prescribes a plurality of different deliberate operational alterations for the respective health strategies to allow for the detection and characterization of FME memory cell health degradation as well as the prediction of future health degradation with a prediction circuit 396. It is contemplated that the controller 392 can prescribe specific, non-operational deliberate alterations to FME cell parameters to conclusively identify and characterize health degradation. However, the non-operational testing may be reserved for particularly drastic wear conditions and the wear module 390 may attempt to keep using operational alterations that can satisfy host-generated data access requests so that a host does not experience a lag or pause in the operation of a memory.

The prediction circuit 396 may operate to translate current and/or past FME memory cell operating conditions into future operating conditions, parameters, and health degradation. One or more wear strategies can be populated by the prediction circuit 396 with several different predicted health degradations corresponding to changes in FME memory cell operation. For example, the prediction circuit 396 can forecast how different changes in FME operation, such as with different read latency, error rate, heat generation, and write latency, can indicate health degradation and, potentially, the presence of a particular wear condition. Such correlation of FME memory cell operational deviations with health degradation allows the health strategies to prescribe more intensive testing to verify the presence of health degradation and/or actions to mitigate and/or repair the health degradation without ever conducting a memory cell test that does not service a pending data access request.

In the event the wear module 390 wants to test an FME memory cell other than during the satisfaction of pending data access requests, the controller 392 can generate one or more tests to efficiently consume processing power and time to determine the presence and type of health degradation. That is, once the controller 392 identifies that a health degradation may be present by altering the operating characteristics during the satisfaction of host-generated data access requests, one or more tests from the controller 392 can verify and characterize any health degradation by taking some, or all, of an FME memory offline temporarily as artificial test patterns generated by the controller 392 are used to plot some, or all, of a hysteresis loop for an FME memory cell.

Through the intelligent use of deviating operational FME memory cell parameters to indicate health degradation and cell conducing health tests generated by the controller 392, the health module 390 can reliably and efficiently determine that the health of particular memory cells has changed. Either when health degradation is expected or verified, the wear module 390, through the assorted health strategies, can choose to repair or mitigate the change in FME operation and/or capabilities. The prediction of future health degradations may additionally allow the wear module 390 to prevent a wear condition from occurring and/or becoming permanent.

It is noted that the presence of heat can exacerbate the degradation of cells and the occurrence of some wear conditions. Hence, the wear module 390 can monitor the volume and presence of heat around assorted FME memory cells. The logging of heat can be useful for other module 390 circuitry to detect current susceptibilities to health degradation and wear conditions as well as accurately predicting future data access operations, patterns, and activity that could threaten, or exacerbate, FME memory cell wear. For instance, the controller 392 can identify physical and logical data addresses where heat is localized in a memory array along with where the generated heat travels to potentially compound data access activity and threaten the health and operating consistency of one or more FME memory cells.

Some embodiments of the wear module 390 generate various operating modes for FME memory cells to prioritize different goals over time. A non-limiting example of operating modes consists of a repair mode that takes actions to provide peak memory performance, a mitigation mode that takes actions to provide the longest usable lifespan for memory cells, and a balance mode that takes actions to provide consistent cell wear and operational performance across assorted memory cells. A mode circuit 398 can operate with the module controller 392 to generate and manage the modes included in a wear strategy. That is, the mode circuit 398 can dictate what modes are available for execution in response to detected, or predicted, memory cell wear.

The mode circuit 398 may further manage the prescribed actions corresponding with a wear strategy mode. For example, the mode circuit 398 can prescribe a first set of actions for a balance mode before removing at least one prescribed action in response to a determination that the action is not a viable option for handling wear to promote the mode goal, such as if the action would create too much heat or consume too much system processing time. The consistent management of the respective modes of a wear strategy ensures the actions executed in response to memory cell wear can reliably alter memory operation to advance the selected mode goal.

The dynamic management of operating modes can be conducted by the health module 390 in response to various operating events, such as identified heat accumulation, cell access errors, deviations from cell performance defaults, and changes in connected hosts. The proactive generation and management of assorted operating modes by the mode circuit 398 allows for efficient reactions to encountered memory operations and events as the controller 392 does not have to generate altered operating parameters in reaction to an event that triggers a change in operating mode for portions of a memory. It is noted that multiple different modes may concurrently be executed by the health module 390, which may produce separate memory cells, pages, planes, blocks, or die operating in different modes with different alterations from default FME memory cell operating parameters.

While the mode circuit 398 can manage a number of different operating modes responsive to memory cell wear, some embodiments configure the wear module 390 with independent circuitry dedicated to providing the best real-time operational alterations to fulfill the goal of the selected mode. As shown, a repair circuit 400 can manage the actions and operational parameters available to return a memory cell to a default hysteresis loop shape, operational performance, and operational capabilities. A mitigation circuit 402 manages actions and operational parameters to reducing the proliferation of wear and/or degradation of memory cell performance due to wear. Similarly, a balance circuit 404 generates, removes, and/or changes action and operational parameters to provide the greatest wear consistency and/or operational performance consistency.

The use of independent mode circuitry, instead of handling all mode aspects with the mode circuit 398, allows for testing of existing, and potential, mode actions and/or operational parameters to current, and predicted, memory conditions. Such testing may be conducted virtually, with the prediction circuit 396, or with actual memory cell access to ensure that the prescribed operational alterations corresponding to a mode have a good chance of successfully enacting the desired result. It is contemplated that the wear module 390 can rank and/or prioritize different actions corresponding to a mode in order of a particular metric, such as power consumed, processing power consumed, time to completion, chance of successful change to cell wear, or number of memory cells undergoing the operational change.

Figure 15:
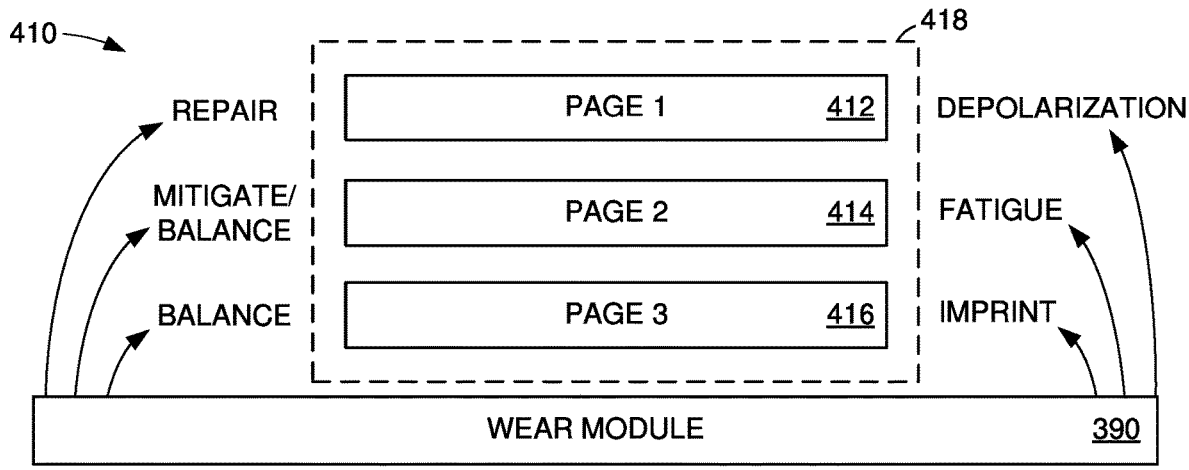
FIG. 15 depicts a block representation of portions of an example wear leveling system operated in accordance with various embodiments.

FIG. 15 depicts a block representation of portions of an example data storage system 410 where a wear module 390 is utilized to monitor and manage wear on memory cells arranged, logically and/or physically, into pages 412. As illustrated, the wear module 390 can diagnose one or more memory cells of a page 412 as experiencing a wear condition currently, or is going to experience a wear condition at the conclusion of a future event, such as satisfaction of a pending data access request or operation in the presence of heat above a set threshold. The diagnosing of current, of future, wear in a memory cell prompts the wear module 250 to evaluate and assign an operational mode to the page to manage the wear.

It is noted that the wear module 390 concurrently diagnoses different portions of memory with different wear conditions that are assigned different operational modes. In the non-limiting system 410 shown in FIG. 15, the wear module 390 identifies, proactively or reactively, that a first page of memory 412 has a depolarization wear condition while a second page of memory 414 has a fatigue wear condition and a third page of memory 416 has an imprint wear condition. Although memory cells of a single page 412/414/416 can experience different wear conditions simultaneously, the wear module 390 can choose to execute one or more operational modes for a page of memory experiencing more than one wear condition. That is, the wear module 390 may conduct different modes, and consequential mode actions, for any logical or physical portion of a memory, such as particular memory cells, pages of memory cells, or die 418 of pages, which corresponds with the wear module 390 and operational modes having a dynamic resolution from memory cell-level to die-level.

Over time, the wear module 390 can adapt the assigned operational mode and/or operational action prescribed by a wear strategy in response to the performance of the memory as well as the needed capabilities to satisfy pending host-generated requests. For instance, the wear module 390 can alter a mode for a page, alter the operational actions executed on memory cells, or suspend a mode to return memory to a default, non-wear operational parameters so that a memory can satisfy one or more requests with sufficient performance, such as access latency, error rate, latency variability, or time to completion. The ability to alter or suspend an operational mode can be complemented by the ability to conduct different modes, or actions prescribed to modes, concurrently on a portion of memory, such as a page, block, plane, or die. In other words, the proactive generation of the wear strategy that prescribes assorted modes and operational deviations to carry out the theme of the mode allows the wear module to intelligently and dynamically implement one or more modes and mode actions to efficiently manage the actual, or predicted, wear of memory cells.

Figure 16:
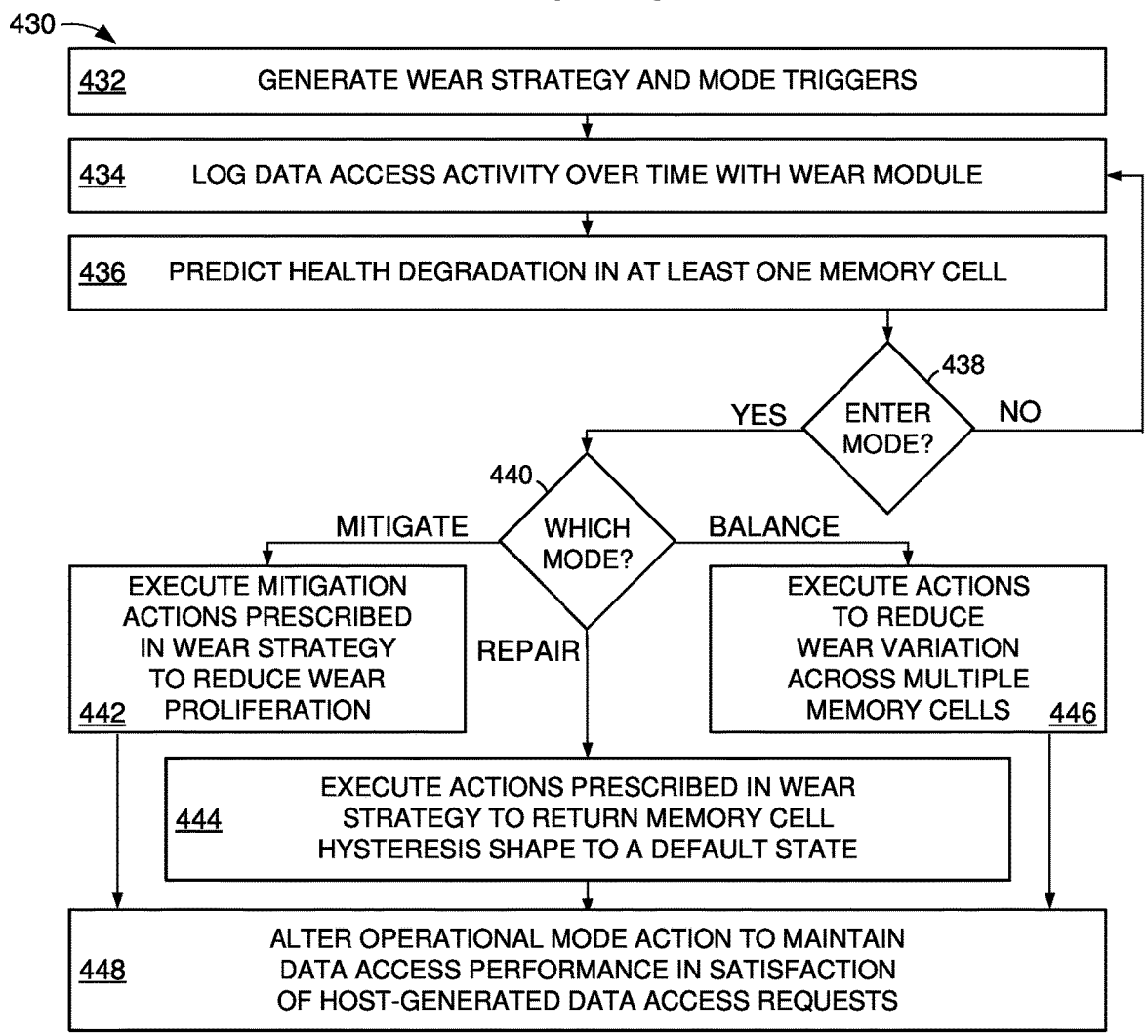
FIG. 16 is a flowchart of an example wear management routine that may be executed as part of a wear leveling system in some embodiments.
Figure 17:
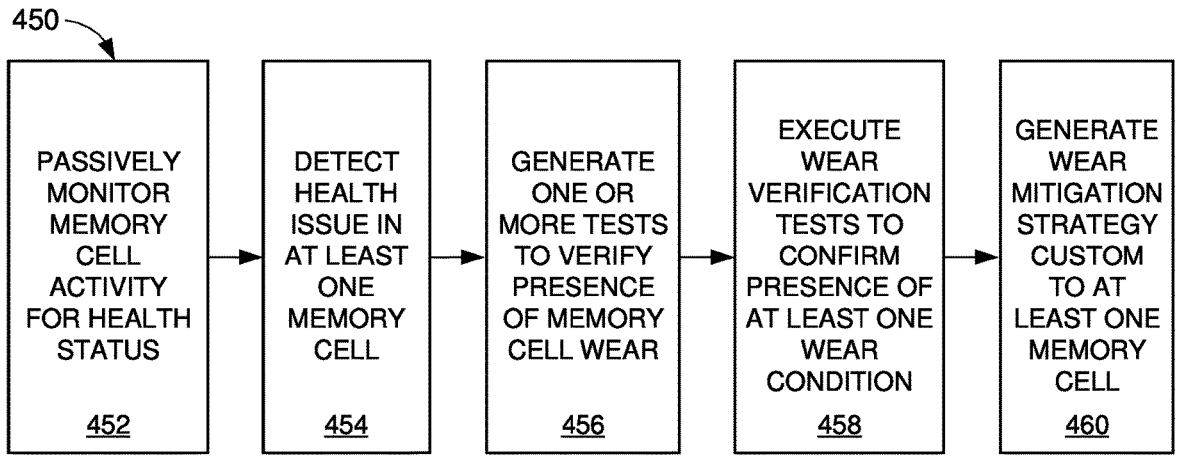
FIG. 17 depicts a block representation of logic that can be practiced with a read destructive memory in accordance with various embodiments.

FIG. 16 is a flowchart of an example wear routine 430 that can be carried out by the assorted embodiments of a wear module and data storage system conveyed in FIGS. 1-15. Connection of a host to a memory employing solid-state non-volatile read destructive memory cells, such as ferroelectric memory cells, allows a wear module to monitor memory cell performance, operational parameters, and host-generated data access requests over time to determine the current presence, or predicted occurrence, of memory cell health degradation and/or a wear condition. It is noted that the wear module can detect actual and/or future memory cell wear without conducting specific cell tests, such as data writing and/or data reading, and, instead, by monitoring cell activity during the satisfaction of data access requests, slightly altering the operating parameters during the satisfaction of host-generated requests, and identifying changes to the default hysteresis loop for at least one memory cell.

Before, during, or after monitoring memory cell activity and determining the current or future presence of cell wear, the wear module can generate a wear strategy in step 432 that provides multiple different operational modes directed to different themes/goals. Step 432 can populate the wear strategy with a variety of operational deviations that can be executed to alter how a memory cell operates from default access parameters to affect the selected operational mode. The wear module may further set one or more operational triggers in step 432 to prompt a module controller to initiate, change, or cancel the execution of a mode and/or mode actions.

With the wear strategy in place, step 434 logs data access activity over time with the wear module. The logged activity can prompt the wear module to initiate artificial deviations from default data access parameters to test for memory cell health degradation and the presence of a wear condition. The logged activity may further be utilized by the wear module to predict future memory wear conditions based on previously experienced wear.

Through the monitoring of data accesses in the satisfaction of host-generated data access requests, either unmodified or modified by the wear module to test for wear, the wear module can predict in step 436 that the hysteresis loop of at least one memory cell is, or will be, altered as part of a wear condition. Such predicted wear may correspond with the current existence of a wear condition, but the condition may not be verified due to the lack of a full test of a memory cell to map the current hysteresis. Hence, the wear module, through the execution of steps 432-436, can accurately predict memory cell wear without a dedicated wear test involving memory cell access and instead based on memory cell response to module-generated slight deviations in data access parameters during the satisfaction of host-generated data access requests.

As a result of the predicted health degradation and the potential presence of a wear condition in at least one memory cell from step 436, the wear module can determine in decision 438 if an portion of memory is to go into a predetermined operational mode of the wear strategy created in step 432. It is contemplated that decision 438 can compare logged data access activity and results of artificially altered access parameters during the satisfaction of host-generated requests to determine if a predetermined mode trigger has been reached or is imminent. If a mode trigger has been reached, or the wear module determines current or future wear can be managed better if an operational mode is entered despite a trigger not being met, decision 440 evaluates a variety of predetermined operational modes of the wear strategy.

It is noted that a wear module can decide to carry out any number, and type, of operational modes in decision 440 concurrently or sequentially that alter at least one operational parameter for one or more memory cells suspected of experiencing wear. Once decision 440 determines an operational mode to enter, the wear module proceeds to execute one or more memory cell operational deviations from default prescribed in the wear strategy to reduce the proliferation of wear (step 442), reshape the hysteresis loop of a memory cell to a default shape (step 444), and/or reduce wear variation across a group of memory cells (step 446).

The wear module, during the execution of the assorted actions associated with the respective operational modes in steps 442/444/446, can evaluate the resulting memory cell performance of one or more memory cells to determine if the executed actions are producing the desired results, such as balancing wear, mitigating wear proliferation, or repairing a cell's hysteresis loop. If the executed actions are not optimally carrying out the chosen operational mode goal, step 448 can alter the operational mode and/or mode action to a different mode/action prescribed by the wear module to provide a better conformance with the chosen operational mode while providing the best possible data access performance during the satisfaction of host-generated data access requests. That is, the wear module in step 448 can determine if the current mode actions are the best actions from the wear strategy to provide the operational mode goal without degrading real-time current data access performance.

With the intelligent and non-invasive detection of memory cell health degradation and wear conditions, a wear module can generate and execute aspects of a wear strategy to manage the wear and provide at least peak data access performance, cell lifespan, or wear consistency across a memory. The ability to manage heat both to decrease the risk of cell depolarization or induce wear to increase cell wear uniformity allows the wear module to provide productive servicing of data access requests despite the presence of wear and volumes of heat. Through the intelligent execution and adaptation of wear mode actions that alter memory cell operational parameters, memory cells operation can evolve and maintain optimal performance for a memory despite correcting, mitigating, or balancing existing wear.

In FIG. 15, a process flow for an example wear characterization routine 450 is shown. The routine 450 can be performed by any data storage device employing read destructive memory cells. Initially in step 452, a wear module passively monitors operation of at least one read destructive memory cell. The passive monitoring in step 452 can involve comparing data access activity to default cell operating parameters. For instance, a wear module can passively monitor a cell by comparing data access latency, error rate, temperature, and reference polarizations to default operating parameters for the memory cell.

If the monitored operating parameter comparison from step 452 indicates a likelihood of health degradation in a memory cell in step 454, the wear module proceeds to generate one or more tests to verify degradation and characterize the presence of any wear conditions, such as imprint, fatigue, and depolarization, in step 456. By customizing the generation of a cell wear test to the memory cell suspected to have wear, the data storage performance impact of any wear can be prevented and performance degradation for the execution of the verifying test(s) can be minimized. The execution of the customized wear verification test(s) in step 458 provides a wear module with confirmation of the presence and type of wear in a memory cell, which allows the wear module to generate a wear mitigation strategy in step 460 that prescribes reactive and/or proactive alterations from a cell's default operating parameters to reduce the proliferation of wear in the cell and/or reduce the performance impact of the existing wear on data access performance for a memory as a whole.

Figure 18:
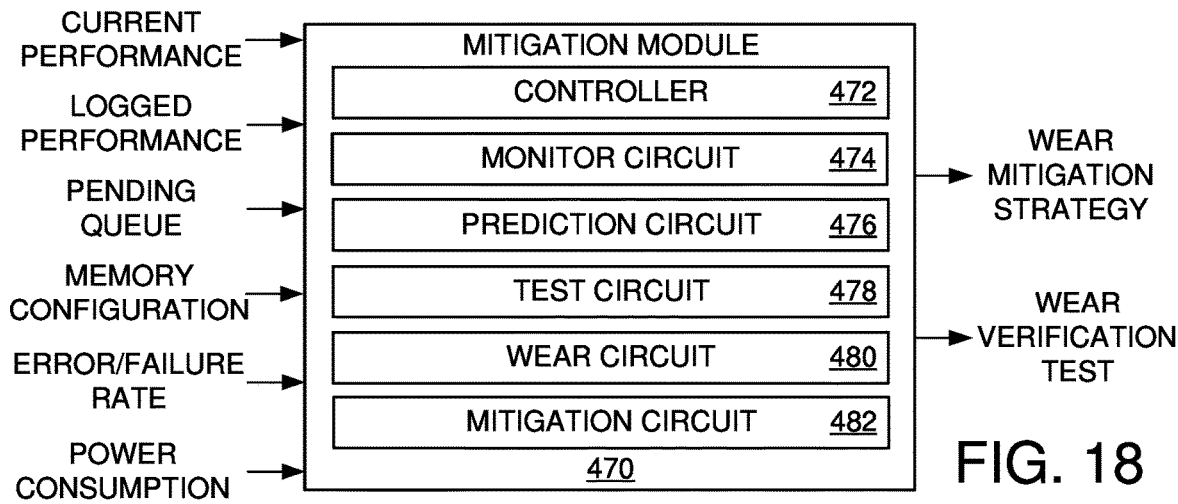
FIG. 18 displays a block representation of an example mitigation module that can operate to carry out assorted embodiments of a wear leveling system.

FIG. 18 depicts a block representation of an example mitigation module 470 that can be employed in a data storage device and data storage system in accordance with various embodiments to provide intelligent memory cell wear monitoring, characterization, and mitigation. The mitigation module 470 can utilize a controller 472, such as a microprocessor or other programmable circuitry, to evaluate past and current memory conditions, operation, and performance to identify the health of FME memory cells and generate wear verification tests and wear mitigation strategies customized to particular cells and groups of cells.

The mitigation module 470 that can be present as software and/or hardware in a data storage device, in a network component, such as a server or node, or in a remote host. One or more controllers 472 that translate assorted input information into at least a wear mitigation strategy and wear verification tests customized to particular memory cells, such as particular physical block addresses in a memory array. That is, a controller 472 can diagnose current and future FME cell wear and generate a wear verification test and wear mitigation strategy to manage how wear impacts data storage performance over time. Accordingly, operation of the mitigation module 470 proactively and/or reactively controls cell wear conditions to increase the performance, longevity, or consistency of memory cell operation despite the presence of memory cell wear.

Although not required or limiting, the mitigation module 470 can input past logged performance of FME memory cells, current detected performance of FME memory cells, how the FME memory cells are configured and calibrated, past and current error/failure rate of FME memory cells, pending data access commands to the FME memory cells, and power consumption for assorted data read and write operations to determine the current health of one or more FME memory cells and generate strategies that mitigate, prevent, and/or repair the health of at least one memory cell. The controller 472 can operate alone, or in combination with other module 470 circuitry, to translate the various input information into the current health of memory cells and the assorted strategies and tests.

A monitor circuit 474 can be used to track data access operations and performance of at least one memory cell to detect deviations from healthy FME memory cell operation without the presence of a wear condition, such as the conditions of FIGS. 4A-4C. The monitor circuit 474 can correlate experienced errors, cell access latency, and heat to a suspicion of FME cell health degradation and, possibly, a particular wear condition being present. It is contemplated that the monitor circuit can track activity to FME cells with dynamic resolution in response to detected errors, heat, and deviation from expected access latency. Such dynamic resolution may track cell activity with other cells of a die/plane/block/page in a first resolution before honing in on a particular cell address or page in a tighter second resolution.

The ability to adjust how and what activities are tracked by the monitor circuit 474 allows the controller 472 to control the volume of processing power and time that is consumed with trying to ascertain the health of FME memory cells. Adjustment of system resources being consumed further allows data addresses storing sensitive data to be tracked with tighter resolution than other addresses storing less sensitive data. The monitor circuit 474 can correlate current, real-time data access operations and performance with the reference voltages, latencies, and error rates set by the controller 472 to determine if a health related deviation is occurring. That is, the controller 472 can generate one or more wear hypothetical parameters that correspond deviations from expected operating conditions to FME wear conditions.

While the controller 472 can operate with the monitor circuit 474 to set, and adjust, the reference voltages to satisfy pending data access requests with data read and/or write operations, some embodiments generate deliberate operational alterations to test and/or verify the presence of a deviation in health for an FME memory cell. For instance, the controller 472 can prescribe using reference voltages for reading and/or writing data that allows for the determination that a cell has degraded health and/or a wear condition. It is noted that the deliberate operational alterations can be conducted to satisfy pending data access requests, but with less than maximum performance, such as lower latency and/or greater production of heat.

In non-limiting embodiments of the mitigation module 470, the controller 472 prescribes a plurality of different deliberate operational alterations for the leveling strategy to allow for the detection and characterization of FME memory cell health degradation as well as the prediction of future health degradation with a prediction circuit 476. It is contemplated that the controller 472 can prescribe specific, non-operational deliberate alterations to FME cell parameters to conclusively identify and characterize health degradation. However, the non-operational testing may be reserved for particularly drastic wear conditions and the wear module 470 may attempt to keep using operational alterations that can satisfy host-generated data access requests so that a host does not experience a lag or pause in the operation of a memory.

The prediction circuit 476 may operate to translate current and/or past FME memory cell operating conditions into future operating conditions, parameters, and health degradation. One or more wear strategies can be populated by the prediction circuit 476 with several different predicted health degradations corresponding to changes in FME memory cell operation. For example, the prediction circuit 476 can forecast how different changes in FME operation, such as with different read latency, error rate, heat generation, and write latency, can indicate health degradation and, potentially, the presence of a particular wear condition. Such correlation of FME memory cell operational deviations with health degradation allows the health strategies to prescribe more intensive testing to verify the presence of health degradation and/or actions to mitigate and/or repair the health degradation without ever conducting a memory cell test that does not service a pending data access request.

In the event the mitigation module 470 wants to test an FME memory cell other than during the satisfaction of pending data access requests, the controller 472 can generate one or more tests to efficiently consume processing power and time to determine the presence and type of health degradation. That is, once the controller 472 identifies that a health degradation may be present by altering the operating characteristics during the satisfaction of host-generated data access requests, one or more tests from the controller 472 can verify and characterize any health degradation by taking some, or all, of an FME memory offline temporarily as artificial test patterns generated by the controller 472 are used to plot some, or all, of a hysteresis loop for an FME memory cell.

Through the intelligent use of deviating operational FME memory cell parameters to indicate health degradation and cell conducing health tests generated by the controller 472, the mitigation module 470 can reliably and efficiently determine that the health of particular memory cells has changed. Either when health degradation is expected or verified, the mitigation module 470, through the assorted health strategies, can choose to repair or mitigate the change in FME operation and/or capabilities. The prediction of future health degradations may additionally allow the mitigation module 470 to prevent a wear condition from occurring and/or becoming permanent.

It is noted that the presence of heat can exacerbate the degradation of cells and the occurrence of some wear conditions. Hence, the mitigation module 470 can monitor the volume and presence of heat around assorted FME memory cells. The logging of heat can be useful for other module 470 circuitry to detect current susceptibilities to health degradation and wear conditions as well as accurately predicting future data access operations, patterns, and activity that could threaten, or exacerbate, FME memory cell wear. For instance, the controller 472 can identify physical and logical data addresses where heat is localized in a memory array along with where the generated heat travels to potentially compound data access activity and threaten the health and operating consistency of one or more FME memory cells.

Some embodiments of the mitigation module 470 generate one or more wear verification test specifically for one or more memory cells, such as a single cell, page, block, plane, die, namespace, or garbage collection unit. A test circuit 478 can evaluate one or more current memory cell activity, operating parameter, and error rate, along with predicted cell wear, to create at least one wear verification test that conducts a cell operation to map the actual, current hysteresis loop for at least one memory cell. A wear verification test can be customized by the test circuit 478 for the number, type, and voltages used for test data writes and reads in order to not exacerbate the wear predicted from passive monitoring of memory cell activity.

It is contemplated that the wear verification test generated by the test circuit 478 is further customized to the pending and/or predicted future data access activity to ensure the cell test does not degrade memory cell performance and satisfaction of a host-generated data access request. For instance, the wear verification test can be customized by the test circuit 478 to perform a module-generated pattern of data writes and/or reads to identify a cell's current hysteresis loop and margin between stable logical states at zero applied voltage to the cell at times that do not degrade the ability of a memory array to service host-generated data access requests to an FME memory. The ability to conduct concurrent testing after passive wear identification while satisfying host-generated data access requests with a memory that is experiencing predicted wear conditions in at least one cell allows for efficient identification of the type and severity of wear with a wear circuit 240 in a memory cell before conducting any wear mitigation activities.

While some embodiments assume a predicted wear condition is present in a memory cell without conducting a wear verification test, other embodiments rely on the verification of a wear condition and severity determined by the wear circuit 480 prior to generating a wear mitigation strategy with a mitigation circuit 482 that prescribes actions that can maximize cell performance, cell lifespan, or cell operational consistency. A mitigation circuit 482 can translate a variety of sensed and predicted memory cell information to create a wear mitigation strategy customized for the cell(s) experiencing wear. The mitigation circuit 482, in some embodiments, prescribes deviations in memory cell operating parameters to repair wear and return a cell to a default hysteresis loop, increase a margin between stable logic states, and/or balance operating performance for a plurality of cells, such as a page, block, or namespace of memory cells.

The execution of a wear mitigation strategy can be intelligently carried out over time as determined by the mitigation module 470. For instance, some prescribed operational deviations from the wear mitigation strategy can be performed during system down times or periods of low data access request volumes while other operational deviations are performed in response to cell activity, such as an error, data becoming out-of-date, or a garbage collection operation. It is contemplated that a wear mitigation strategy can prescribe dynamic operating parameter ranges that are conducted to progress the repair of wear over time.

At the conclusion of a wear mitigation strategy, a memory cell can have minimal deviations from a default hysteresis loop and logic state margin, but in some embodiments the wear mitigation strategy can result in wear proliferation being halted and a wear condition allowed to remain in the cell. That is, execution of a wear mitigation strategy can cure wear or prevent wear from getting worse while mitigating the impact of the wear on data access performance to satisfy host-generated data access requests. Hence, the completion of a wear mitigation strategy customized to a memory cell's wear condition provides efficient and reliable handling of cell wear that can provide increased cell performance, lifespan, and/or operational consistency compared to other memory cells.

Figure 19:
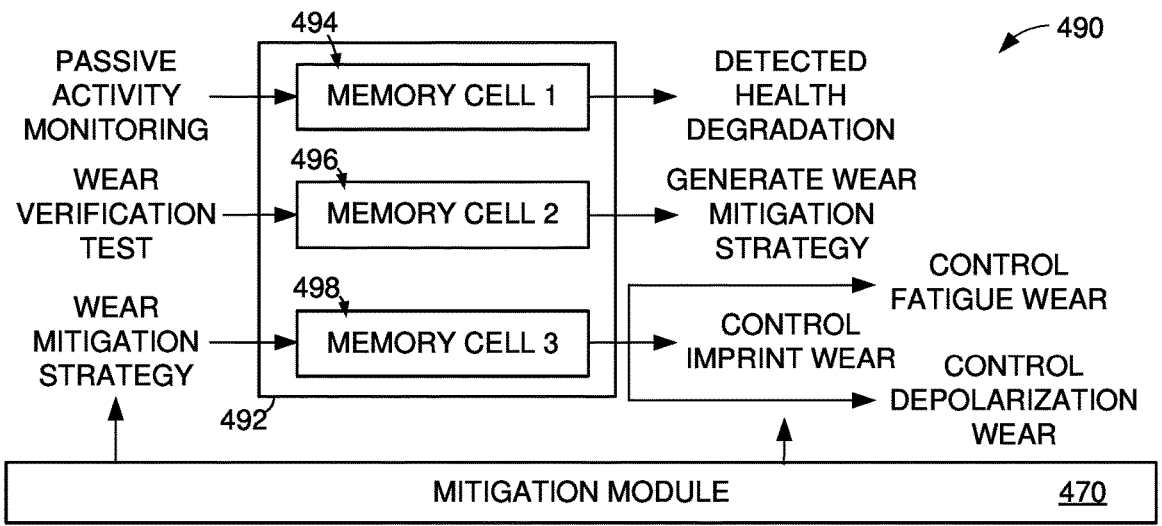
FIG. 19 illustrates a block representation of portions of an example wear leveling system arranged in accordance with some embodiments.

FIG. 19 depicts a block representation of portions of an example data storage system 490 in which a mitigation module 470 is connected to a memory array 492 consisting of read destructive memory cells. In accordance with various embodiments, the mitigation module 470 conducts passive monitoring of the operation of first 494, second 496, and third 498 memory cells of the array 492 for a period of time until cell activity, cell operation, and/or cell performance prompt the mitigation module 470 to predict a wear condition is present or eminent.

Upon prediction of a wear condition, the mitigation module 470 generates one or more wear verification tests with actions and/or operational deviations from default to map at least portions of a cell's current hysteresis loop and define the cell's stable logic states. While the second memory cell 496 is undergoing wear verification test operations, the mitigation module 470 may pause or throttle pending data accesses to the cell 476. It is noted that the verification of wear may be conducted during the satisfaction of one or more host-generated data access requests and may involve a pattern of module-generated cell reads and/or writes prescribed by a wear verification test.

Once the health and operational capabilities of the second memory cell 496 are ascertained through the actions of a wear verification test, the mitigation module 470 can determine what, if any, wear mitigation operations are to be conducted. For instance, the mitigation module 470 may conclude that wear is present in the second memory cell 496, but the cost, in terms of processing, power, and time, of executing wear mitigation actions do not justify the reduction of cell performance due to health degradation and/or wear. The mitigation module 470 may, alternatively, determine that no wear or health degradation is present in the cell, which may prompt the alteration of one or more prediction algorithms to more accurately translate passively monitored cell activity and performance into predicted health degradation and/or wear conditions being present.

In the event the operations prescribed by a wear verification test results the verification of predicted wear, the mitigation module 470 classifies the wear condition and severity of the wear. For example, wear can be classified as imprint, fatigue, or depolarization types of memory cell health degradation by the mitigation module 470, which allows a wear mitigation strategy to more accurately and efficiently control the data access performance of memory cells experiencing wear. Thus, the mitigation module 470 proceeds to generate a wear mitigation strategy directed at optimizing memory cell operation for performance, longevity, or balance in response to the wear verification test confirming the presence and severity of memory cell wear.

While not required or limiting, a wear mitigation strategy can be based on current, past, and/or future memory cell configurations and operations to provide a theme, or goal, for memory cell performance in response to the presence of memory cell wear. For instance, the mitigation module 470 can proactively evaluate at least the logical and physical arrangement of memory cells as well as logged memory cell performance, errors, and power consumption to generate alterations to future memory cell operation that are directed to a theme/goal, such as repairing wear, mitigating the impact of wear, or balancing wear across multiple memory cells.

A wear mitigation strategy can consist of several different actions that alter the operation of memory cells to carry out a goal/theme associated with future memory cell performance. A memory cell repair theme for wear mitigation can be directed to correcting cell wear and returning a memory cell to default operational parameters and/or performance. A memory cell wear control theme for wear mitigation can be directed to reducing the proliferation of wear, cell performance degradation, or both while a wear balance theme wear mitigation can be directed to providing consistent memory cell wear and/or performance for several memory cells of a page, block, plane, die, or memory. The availability of different themes for memory cell wear mitigation in response to detected, or predicted, wear allows a module 470 to efficiently transition at least one memory cell from a default operational stage that utilize default parameters, such as reference voltage, latency, background operations, and error correction, to stage parameters assigned to effect a particular theme/goal.

In accordance with some embodiments, wear mitigation with a repair theme can correspond with logically or physically altering a programmed cell state, such as from 1 to 0 or vice versa, without a host-generated request for such a cell write operation, reordering the execution of pending data access requests, and reading a cell without a pending request to remove the polarization in the cell. Such cell wear repairing actions over time can reverse imprint, fatigue, and depolarization wear conditions by manipulating the magnetization, heat, and cyclic rate of cell reading and/or writing. It is contemplated that the repair theme for wear mitigation can pivot between different cell operational alterations over time in response to detected, or predicted, memory cell wear status before returning to default cell operating parameters once cell wear has been fully corrected. Some embodiments generate new default operating parameters in the event a cell cannot be fully repaired, which can correspond with a hysteresis loop not returning from a degraded shape to a default shape. Such generation of new default operating parameters, such as reference voltage, write power, and number of logical states stored in a single memory cell, can be characterized as recalibration.

Altering the settings/parameters associated with memory cell reading and/or writing may be customized to mitigate further degradation of wear and/or performance associated with wear as part of a wear control theme for a wear mitigation strategy. In other words, cell recalibration actions can operate to correct memory cell wear, stop wear from progressively getting worse in at least one cell, or reduce the data access performance degradation resulting from the presence of wear. A wear control theme may also involve throttling the satisfaction of data access requests to a memory. For example, throttling may artificially slow the execution of data access requests, which may involve inserting time delays, altering clock cycles, or conducting data reads instead of data writes for a predetermined amount of time. The throttling of memory cell operation can involve changing the frequency and/or location of cell background operations, such as error correction, cell refresh, data mapping, and garbage collection.

With several memory cell wear conditions being exacerbated by the presence of heat, such as above 70° C., assorted actions can be executed to manage heat in a memory array. For instance, heat management can involve changing the physical location of data writes, changing the programming voltages and/or time duration of data writes, and caching of data writes so that data reads can be conducted to some portions of a memory array, such as a lower level of a 3D stack of memory cells. While cell wear control theme can increase the longevity and usable lifespan of cells experiencing wear, the peak performance of cells with a wear condition will not return, which contrasts the results of the repair theme for a wear mitigation strategy. As such, the actions of the wear control themed strategy can be directed to maintaining a minimum data access performance for memory cells for an extended amount of time instead of enabling peak cell performance.

It can be appreciated that repair theme actions for a mitigation strategy are directed to providing peak cell performance while wear control themed operational stage actions are focused on cell operational longevity. However, various hosts can demand memory cell operational consistency, such as in the satisfaction of a service level agreement, quality of service standard, or deterministic window. Such consistency is measured in cell performance variability over time, which is different than peak performance or cell lifespan. That is, the actions of a balance theme for a wear mitigation strategy can be directed to providing cell operation that is consistent with minimal variation over time instead of maximum possible data access performance. To that end, the balance theme can move data between different memory cell physical block addresses, repurpose memory cells for different types of data storage, and/or induce wear in memory cells to create a more uniform level of wear in a memory, page, block, plane, or die.

To carry out the movement of data in response to detected, or predicted memory cell wear, a wear mitigation strategy can identify destination physical block addresses. The proactive identification of destination locations for cells experiencing wear, such as imprint, fatigue, and depolarization, allows for efficient transition of data and mitigation of wear in the initially written memory cell. The movement of data can correspond with an initially written memory cell being assigned an unavailable designation so that the wear present in the memory cell does not get worse. It is contemplated that a worn cell that has had data moved to a different memory cell can be programmed to a polarization that prevents exacerbation of existing wear, such as a zero polarization or fraction of an opposite polarization of the previously written data.

Repurposing memory cells can involve altering the type, size, or security of data being stored in a memory cell. Repurposing may also involve changing how a memory cell operates, such as utilizing cells for long-term storage, short-term cache storage, multi-level pair of logical states, or single level pair of logical states. The use of cell repurposing can change the volume of data reads and/or writes to a memory cell and the type of repurposing can be chosen with respect to the type and severity of cell wear to prevent future cell wear. For instance, an imprint wear condition may prompt a repurposing that involves long-term storage of data while a depolarization wear condition may prompt a repurposing of a memory call as backup cache short-term storage.

While mitigating the proliferation of wear in cells experiencing a wear condition can balance wear across a memory as other memory cells experience health degradation and wear over time. However, such wear balancing by slowing, or stopping, wear proliferation can be relatively slow and involve consistent alterations to cell operation, which consumes higher than average amounts of system processing power and capability. Hence, some embodiments of wear balancing conduct actions to actually induce wear in one or more memory cells. For example, non-requested data reads and/or writes can be conducted on cells to concentrate heat and/or cause health degradation, such as depolarization, imprint, and fatigue conditions.

The ability to choose between different actions to carry out as part of a wear mitigation strategy, along with the ability to change to different themes, allows for dynamic and intelligent management of detected, or predicted, wear. Through the proactive generation of a wear mitigation strategy that prescribes various themes that respectively comprise assorted operational changes that can be conducted to repair wear, mitigate wear, or balance wear, memory cell health degradation can be quickly controlled and managed to maintain data storage performance, such as average data access latency, error rate, or average power consumption.

It is contemplated that the wear mitigation strategy has one or more operational progressions to control memory cell wear, which may correspond with different levels of detected, or predicted, wear. For instance, a wear mitigation strategy can proactively prescribe different theme progressions, potentially with different cell operational triggers, for individual memory cells or groups of memory cells, such as physical blocks, physical die, logical garbage collection units, or logical namespaces. Such theme progressions can be based on previously logged data access activity and/or performance, with customizes the progressions to provide the greatest longevity for peak performance and memory cell usable lifespan. It is contemplated that the wear module 230 sets singular goals throughout memory cell wear mitigation, such as peak performance, access latency consistency, or lifespan, with a customized progression of different operational parameter alterations prompted by preset triggers.

The mitigation module 470 can conduct dynamic management of memory cell operating parameters to control wear mitigation in response to various operating events, such as identified heat accumulation, cell access errors, deviations from cell performance defaults, and changes in connected hosts. The proactive generation and management of assorted operating parameters allows for efficient reactions to encountered memory operations and events as local controllers do not have to generate altered operating parameters in reaction to an event that triggers a change in operating mode, or wear mitigation theme, for portions of a memory. It is noted that multiple different themes may concurrently be executed by the mitigation module 470 on different memory cells, which may produce separate memory cells, pages, planes, blocks, or die operating with different alterations from default FME memory cell operating parameters.

The use of independent circuitry, instead of handling all operating stage generation and execution with a single circuit or controller, allows for testing of existing, and potential, stage actions and/or operational parameters to current, and predicted, memory conditions. It is contemplated that the mitigation module 470 can rank and/or prioritize different actions corresponding to wear mitigation themes in order of a particular metric, such as power consumed, processing power consumed, time to completion, chance of successful change to cell wear, or number of memory cells undergoing the operational change.

Figure 20:
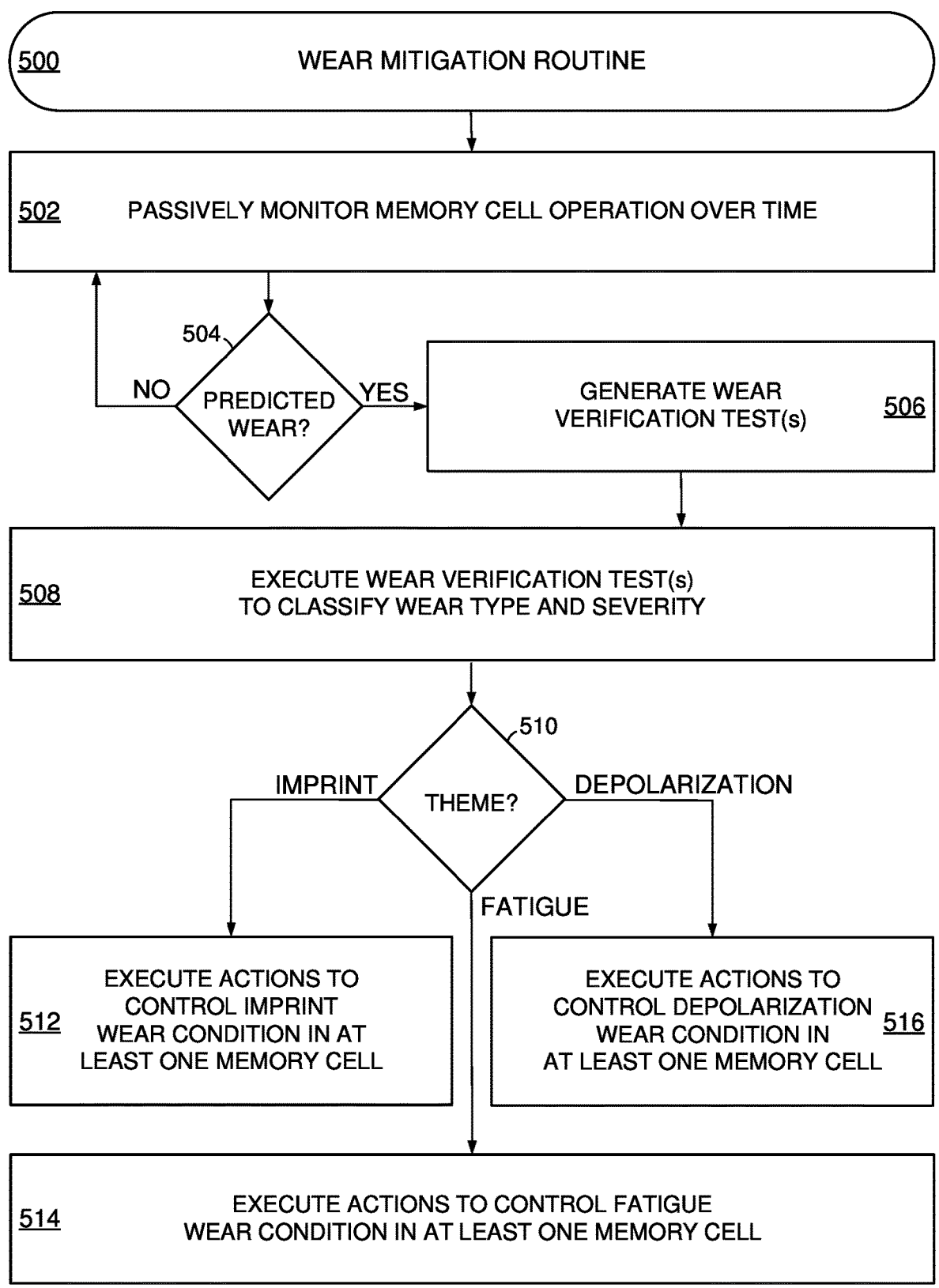
FIG. 20 is a flowchart of an example wear mitigation routine that may be carried out in embodiments of a memory employing read destructive memory cells.

FIG. 20 conveys an example wear mitigation routine 500 that can be carried out by the assorted embodiments of a wear module connected to an array of solid-state non-volatile read destructive memory cells, such as ferroelectric memory cells. Step 502 begins with the wear module evaluating assorted aspects of memory, such as cell configuration, default cell operating parameters, default cell hysteresis loop configuration, and processing capability of a data storage system, to enable passive monitoring of memory cell activity and performance. The passive monitoring of memory cell activity and performance can accumulate information about the health of at least one cell.

Decision 504 compares current cell operation to default cell operating parameters to aid in the accurate prediction of health degradation in at least one memory cell. As a result, decision 504 can evaluate if a wear condition is predicted for one or more memory cells. If no wear is predicted, step 502 continues to accumulate information about memory cells to accurately forecast cell health degradation and wear. A prediction of cell wear triggers decision 504 to execute step 506 where one or more wear verification tests are generated. Although a wear verification test is not required, assorted embodiments execute a test from step 506 in step 508 to confirm the presence of wear, classify the type of cell wear, and determine the severity of the wear condition.

The execution of the wear verification test customized to the cell being tested heightens the accuracy and efficiency of wear verification and classification. The characterization of the type and severity of wear allows decision 510 to determine a wear mitigation theme and actions to carry out the selected theme while controlling, and not proliferating, the wear present in a memory cell. That is, decision 510 generates a wear mitigation strategy that prescribes actions and/or cell operational parameter deviations directed to prevent wear from getting worse while affecting a chosen mitigation theme, such as peak performance, cell lifespan, or performance balancing.

Decision 510 can additionally determine the sequence, timing, and operational triggers associated with actions of a wear mitigation strategy. The actions chosen by a wear module for a wear mitigation strategy can, in some embodiments, be customized to the type and severity of wear present in a memory cell. For example, wear mitigation strategy actions can be directed, in step 512, to stopping the progression of imprint wear, repairing imprint wear, and/or maintaining cell performance despite the presence of imprint wear. Such imprint wear actions can deviate current, default memory cell operating parameters, such as power consumption, reference voltage, refresh rate, and error correction, to control the shift in portions of the cell's hysteresis loop due to imprint-type wear.

From decision 510, wear mitigation strategy actions can be directed to controlling fatigue-type wear conditions in step 514. Due to fatigue wear being associated with repeated reversals in polarization for a memory cell, deviations in cell operating parameters in step 514 will likely be different than the actions to control imprint-type wear in step 512. For instance, step 514 can prescribe actions on, and around, the physical location of a worn memory cell to reduce heat, as temperature can exacerbate the proliferation of fatigue-type wear conditions. By reducing the reference voltages for cells that are not worn, but are proximal to a cell experiencing fatigue-type wear, temperature can be controlled and fatigue wear conditions can be repaired or controlled more efficiently. A non-limiting example wear mitigation strategy action in step 514 involves maintaining a fatigue-type wear condition and repurposing the memory cell to be utilized less often than previously configured.

The control of heat in and around a worn memory cell may also be employed if decision 510 directs a wear mitigation strategy to control a depolarization-type wear condition in step 516. The weakening of portions of a cell's hysteresis loop during a depolarization wear condition can be repaired or controlled with strategy actions directed to reducing the time a cell is held at a particular logic state (1/0) and/or the voltage with which logic states are written and read. It is noted that wear mitigation strategy actions for step 516 can temporarily, or permanently, alter default cell operating parameters to lower the heat, time held at a particular polarization, number of polarization reversals, and read refresh frequency.

Through the intelligent and non-invasive detection of memory cell health degradation and wear conditions, a leveling module can generate and execute aspects of a leveling strategy to provide customized wear schedules for various portions of a solid-state read destructive memory. The generation and execution of wear stage schedules in response to passively monitored wear allows the leveling module to provide maximum efficiency in the satisfaction of host-generated data access requests despite the presence of wear in assorted memory cells. By prescribing evolving deviations from memory cell default operating parameters through entering different wear stages in response to cell wear reaching predetermined triggers, dynamic memory cell operational goals can be achieved without undue system processing or power consumption that would be associated with reacting to cell wear without a leveling strategy.

By utilizing slightly altered operating parameters in the satisfaction of host-generated data access requests to detect FME memory cell health degradation, a health module can conduct power, and processing, intensive cell tests only when necessary. The ability to monitor memory cell health without specific tests allows a health module to mitigate the proliferation of wear as less cell writing and reading is needed. As a result of the proactive generation of health strategies and cell operational modes, a health module can keep a memory cell operations despite the presence of wear, can mitigate the data storage performance effects of wear, and can repair cell hysteresis loop to a default condition with minimal reduction in overall data storage performance. The prediction of cell health alterations further allows the health module to carry out assorted operational modes without taking memory offline or otherwise reducing the capabilities and real-time performance of a data storage device.

Through the assorted evaluations and decisions for a wear module during the execution of assorted routines, passive monitoring of memory cell activity leads to efficient prediction of cell health degradation and/or wear conditions. The intelligent generation and execution of wear verification tests can confirm the prediction of wear while classifying the type and severity of such wear, which allows the wear module to generate a wear mitigation strategy that is intelligently customized to the type of wear condition present in a cell as well as directed to a theme (repair/balance/control). Such flexibility and diverse wear mitigation strategy actions allows the wear module to optimize the control and mitigation of cell wear without degrading data storage performance for a memory array experiencing wear. The ability to customize wear testing and mitigation strategy actions for particular memory cells, or groups of cells, allows a data storage system to concurrently control different types of wear conditions with minimal loss in data access capabilities and performance in satisfaction of host-generated data access requests.

What is claimed is:

1. A method comprising:
generating a leveling strategy with a wear module connected to an array of ferroelectric memory cells, the leveling strategy prescribing a plurality of memory cell operating parameter deviations associated with different amounts of cell wear;
monitoring activity of a memory cell of the array of ferroelectric memory cells with the wear module;
detecting an amount of wear in the memory cell as a result of the monitored activity; and
changing a default set of operating parameters for the memory cell using the prescribed memory cell operating parameter deviations to a first stage of operating parameters, as prescribed by the leveling strategy, in response to the detected amount of wear.

2. The method of claim 1, wherein the detection of memory cell wear is achieved without dedicated test of the memory cell and during the satisfaction of a pending host-generated data access request.

3. The method of claim 1, wherein an amount of wear in the memory cell is predicted by the wear module as a result of the monitored activity.

4. The method of claim 3, wherein a data access parameter of the memory cell is adjusted to confirm the amount of wear.

5. The method of claim 4, wherein the amount of wear is confirmed prior to changing the default set of operating parameters.

6. The method of claim 1, wherein the leveling strategy prescribes multiple different wear stages for the memory cell prior to the memory cell experiencing wear, each wear stage corresponding with different operating parameters directed to different wear mitigation goals.

7. The method of claim 1, wherein the detection of memory cell wear is achieved without dedicated test of the memory cell and during the satisfaction of a pending host-generated data access request.

8. The method of claim 1, wherein the at least one action of the leveling strategy artificially induces wear in at least one memory cell to increase consistency of wear among a die set of the array.

9. The method of claim 1, wherein the at least one action of the leveling strategy mitigates the proliferation of wear in the array.

10. The method of claim 1, wherein the at least one action of the wear strategy repairs wear in a memory cell of the array to return the memory cell to a default hysteresis loop shape and size.

11. A physical article of manufacture including one or more tangible computer-readable storage device, encoding computer-executable instructions for executing on a computer system a computer process for multi-level error correction, the computer process comprising:
generating a leveling strategy with a wear module connected to an array of ferroelectric memory cells, the leveling strategy prescribing a plurality of memory cell operating parameter deviations associated with different amounts of cell wear;
detecting an amount of wear in a memory cell of the array of ferroelectric memory as a result of monitoring activity of a memory cell of the array of ferroelectric memory cells with the wear module; and
changing a default set of operating parameters for the memory cell using the prescribed memory cell operating parameter deviations to a first stage of operating parameters, as prescribed by the leveling strategy, in response to the detected amount of wear.

12. The physical article of manufacture of claim 11, wherein the detection of memory cell wear is achieved without dedicated test of the memory cell and during the satisfaction of a pending host-generated data access request.

13. The physical article of manufacture of claim 11, wherein an amount of wear in the memory cell is predicted by the wear module as a result of the monitored activity.

14. The physical article of manufacture of claim 13, wherein a data access parameter of the memory cell is adjusted to confirm the amount of wear.

15. The physical article of manufacture of claim 14, wherein the amount of wear is confirmed prior to changing the default set of operating parameters.

16. The physical article of manufacture of claim 11, wherein the leveling strategy prescribes multiple different wear stages for the memory cell prior to the memory cell experiencing wear, each wear stage corresponding with different operating parameters directed to different wear mitigation goals.

17. The physical article of manufacture of claim 11, wherein the detection of memory cell wear is achieved without dedicated test of the memory cell and during the satisfaction of a pending host-generated data access request.

18. The physical article of manufacture of claim 11, wherein the at least one action of the leveling strategy artificially induces wear in at least one memory cell to increase consistency of wear among a die set of the array.

19. The physical article of manufacture of claim 11, wherein the at least one action of the leveling strategy mitigates the proliferation of wear in the array.

20. The physical article of manufacture of claim 11, wherein the at least one action of the wear strategy repairs wear in a memory cell of the array to return the memory cell to a default hysteresis loop shape and size.

* * * * *